US006930516B2

(12) United States Patent
Gabara

(10) Patent No.: US 6,930,516 B2
(45) Date of Patent: Aug. 16, 2005

(54) COMPARATOR CIRCUITS HAVING NON-COMPLEMENTARY INPUT STRUCTURES

(75) Inventor: Thaddeus John Gabara, Murray Hill, NJ (US)

(73) Assignee: Agere Systems Inc., Allentown, PA (US)

( * ) Notice: Subject to any disclaimer, the term of this patent is extended or adjusted under 35 U.S.C. 154(b) by 335 days.

(21) Appl. No.: 09/870,436

(22) Filed: May 30, 2001

(65) Prior Publication Data

US 2002/0180589 A1 Dec. 5, 2002

(51) Int. Cl.[7] .............................................. G01R 19/00
(52) U.S. Cl. ........................ 327/51; 327/63; 340/146.2
(58) Field of Search ............................. 327/50–52, 57, 327/63–65, 68, 69, 90, 97; 340/146.2; 365/189.05–189.09

(56) References Cited

U.S. PATENT DOCUMENTS

| | | | | |
|---|---|---|---|---|
| 4,694,205 A | * | 9/1987 | Shu et al. .................... 327/53 |
| 4,694,274 A | * | 9/1987 | Shimada et al. ......... 340/146.2 |
| 4,841,279 A | * | 6/1989 | Walters, Jr. ............. 340/146.2 |
| 5,319,348 A | * | 6/1994 | Lee et al. ................ 340/146.2 |
| 5,563,531 A | | 10/1996 | Meyer ............................ 327/3 |
| 5,576,837 A | | 11/1996 | Strolle et al. ................. 386/33 |
| 5,606,625 A | | 2/1997 | Dallavalle et al. .......... 381/107 |
| 5,636,252 A | | 6/1997 | Patel et al. .................. 375/345 |
| 5,687,127 A | * | 11/1997 | Takahashi .................... 365/205 |
| 5,729,159 A | * | 3/1998 | Gersbach ..................... 327/52 |
| 5,748,070 A | * | 5/1998 | Priebe et al. ............. 340/146.2 |
| 5,774,084 A | * | 6/1998 | Brombaugh et al. ........ 341/152 |
| 5,790,063 A | | 8/1998 | Koifman et al. ............ 341/155 |
| 5,856,949 A | * | 1/1999 | Jiang ........................... 365/203 |

(Continued)

FOREIGN PATENT DOCUMENTS

| | | | |
|---|---|---|---|
| JP | P2003-69394 A | * 3/2003 | |

OTHER PUBLICATIONS

U.S. Appl. No. 09/162,852, filed Sep. 29, 1998, Gabara et al.

J. Montanaro et al., "A 160–MHz, 32–b, 0.5–W CMOS RISC Microprocessor," IEEE Journal of Solid–Sate Circuits, vol. 31, No. 11, pp. 1703–1714, 1996.

J.–C. Kim et al., "CMOS Sense Amplifier–Based Flip–Flop with Two N–C$^2$MOS Output Latches," Electronics Letters, vol. 36, No. 6, pp. 498–500, 2000.

Primary Examiner—Timothy P. Callahan
Assistant Examiner—Hai L. Nguyen

(57) ABSTRACT

A non-complementary comparator includes an evaluation element such as a memory cell, a differential amplifier, or another type of circuit capable adapted to perform an evaluation function, and at least first and second input legs each coupled to a corresponding one of a first and second node of the evaluation element. The first and second input legs have non-complementary structures relative to one another, with each of the non-complementary structures having associated therewith a variable parameter, e.g., a variable resistance, variable current or variable voltage, having a value that is a function of a corresponding input signal. The evaluation element performs a comparison of at least first and second inputs applied to the respective first and second input legs. The input legs may each be implemented as a weighted array of transistors, with each of the transistors in the weighted array associated with a given leg corresponding to a particular bit or other portion of an input signal applied to that leg. The non-complementary comparator may be used as a multi-digit comparator to determine the relative weight of digital words, or to implement other comparator circuits such as, e.g., majority rule circuits, analog common mode comparators, greater than/less than circuits, array addition and comparison circuits, serial adder-binary search (SA-BS) circuits, analog adders, add-compare-select (ACS) circuits, coupled memory cell comparators, and comparators with mask functions.

40 Claims, 32 Drawing Sheets

U.S. PATENT DOCUMENTS

| | | | |
|---|---|---|---|
| 5,877,718 A | | 3/1999 | Andoh et al. ................. 341/155 |
| 5,901,087 A | * | 5/1999 | Pascucci ................. 365/185.21 |
| 5,959,921 A | * | 9/1999 | Manning et al. ............. 365/208 |
| 6,005,816 A | * | 12/1999 | Manning et al. ............. 365/208 |
| 6,054,918 A | * | 4/2000 | Holst ....................... 340/146.2 |
| 6,097,768 A | | 8/2000 | Janesch et al. ................ 375/30 |
| 6,184,722 B1 | * | 2/2001 | Hayakawa .................... 327/55 |
| 6,191,620 B1 | * | 2/2001 | Lattimore et al. ............. 327/55 |
| 6,191,623 B1 | * | 2/2001 | Gabara ........................ 327/71 |
| 6,255,861 B1 | * | 7/2001 | Zhang ......................... 327/51 |
| 6,256,247 B1 | * | 7/2001 | Perner ........................ 365/209 |
| 6,278,308 B1 | * | 8/2001 | Partovi et al. ............... 327/218 |
| 6,292,093 B1 | * | 9/2001 | Su et al. ................... 340/146.2 |
| 6,330,188 B1 | * | 12/2001 | Pascucci .................. 365/185.2 |
| 6,424,181 B1 | * | 7/2002 | Pogrebnoy .................... 327/55 |
| 6,476,646 B2 | * | 11/2002 | Sim et al. ..................... 327/55 |
| 6,538,476 B2 | * | 3/2003 | Forbes ........................ 327/57 |
| 6,590,805 B2 | * | 7/2003 | Lu et al. .................... 365/158 |
| 6,597,225 B1 | * | 7/2003 | Gabara ....................... 327/211 |

\* cited by examiner (A)

(B)

```
/* initialize */
n=8 ;
a[n] = 1;
for (k=1; k<n; k++)
   a[k]=0;

for (i=0; i<n; ++i) /* i=clock tick*/
   if (out = 0)
      a[n-i-1] = 1;
   else {
      a[n-i] = 0;
         if (i < n - 1)
            a[n-i-1] = 1;

/* addition result is in array a[n] */
```

|  | POWER (μW) | | TRANSISTOR COUNT | | DELAY (pSEC) | |
| --- | --- | --- | --- | --- | --- | --- |
|  | ADD COMPARE | SELECT | ADD COMPARE | SELECT | ADD COMPARE | SELECT |
| CONVENTIONAL | 2000 | 200 | 5215 | 58 | 1120 | 200 |
| SEESAW | 100 | 300 | 55 | 108 | 516 | 173 |
| GAIN FACTOR | X20 | X0.66 | X95 | X0.54 | X2.17 | X1.15 |

US 6,930,516 B2

COMPARATOR CIRCUITS HAVING NON-COMPLEMENTARY INPUT STRUCTURES

FIELD OF THE INVENTION

The present invention relates generally to electronic circuits, and more particularly to sense amplifiers, differential amplifiers and other comparator circuits that perform comparisons of two or more input signals.

BACKGROUND OF THE INVENTION

Very large scale integration (VLSI) integrated circuits and other types of electronic circuits commonly include circuits for performing the comparison of two or more signals. The latter circuits are referred to herein as comparator circuits or simply comparators, and may be implemented in the analog domain or the digital domain.

In the analog domain, two fundamental comparators are the analog sense amplifier and the differential amplifier. The differential amplifier is also referred to as an operational amplifier or simply op-amp. These analog comparator circuits typically resolve the difference between two signals that are complements of one another, where in this context the complement of one of the two signals may be defined as the other signal mirrored around a common mode signal.

FIG. 1 illustrates the concept of complementary signals in the analog domain. As shown in the figure, a common-mode input voltage $V_{CM}$ is the arithmetic mean of two signals $V_A$ and $V_B$, and is defined as $(V_A+V_B)/2$. Since signals $V_A$ and $V_B$ are equally displaced above and below the common mode voltage $V_{CM}$ by an amount $\Delta$, these two signals are the analog complements of one another. The separation of $V_A$ and $V_B$ is known as the differential-mode input voltage and is given by $V_D=(V_A-V_B)=2\Delta$. The two input signals can thus be represented as a common-mode component and a differential-mode component. When the magnitude of $\Delta$ is small, these analog comparator circuits perform amplification and can therefore be used to sense very small voltage differences.

FIGS. 2A and 2B show examples of conventional differential amplifiers. The voltage supplies for these and other circuits described herein are illustratively Vdd and ground, but other supplies could of course be used. For example, Vss voltage supply values other than ground could be used.

A differential amplifier is an analog amplifier that has the capability of extracting a signal with respect to another signal. The other signal can be a common-mode value or its complement. Referring to FIG. 2A, the differential amplifier receives two balanced inputs $V_A$ and $V_B$. The generation of the signals $V_{nch}$ and $V_{pch}$ follows conventional rules. In the differential amplifier of FIG. 2B, the two input signals are the signal $V_A$ and the common mode voltage $V_{CM}$. Both of these differential amplifiers compare the difference between their two input signals and generate one or more outputs. More particularly, the FIG. 2A differential amplifier generates an output signal out and its complement out, and the FIG. 2B differential amplifier generates the complement output signal out.

FIGS. 3A and 3B show examples of conventional sense amplifiers. Each of the sense amplifiers includes transistors m1, m2, m3, m4, m5 and m6 arranged as shown. It should be noted that for simplicity of illustration transistor designations m1, m2, m3, etc. will be reused herein to designate different transistors in different circuits. These designations should therefore not be construed as denoting common elements in all figures.

The transistors m1 and m2 in the circuits of FIGS. 3A and 3B form a cross-coupled portion that provides positive feedback during an evaluation operation of the sense amplifier. When an input clock signal ck applied to the gates of m3 and m4 is high, the circuit is initialized and m3 equalizes the potential at the output nodes. In FIG. 3A, an input signal $V_A$ and its complement $V_B$ are each applied to one of the evaluation "legs" of the sense amplifier which in this example correspond to transistors m5 and m6, respectively. The evaluation legs are also referred to herein as input legs. In FIG. 3B, the input signal $V_A$ is compared against the common mode voltage $V_{CM}$.

Both the FIG. 3A and FIG. 3B circuits are evaluated when the clock signal ck goes low. Note that for a small differential-mode signal, both evaluation legs, i.e., the left leg (m5) and the right leg (m6), can be enabled. This will prevent the output nodes from achieving full digital values and will cause additional power dissipation.

In the digital domain, sense amplifiers can be used to perform comparisons between two digital Boolean functions that are complements of one another. A trivial case is when a Boolean function and its inverse are compared. For example, assume input signal $V_B$ is the Boolean complement of input signal $V_A$. Note that if $V_A=0$, $V_B=1$ and vice versa. The sense amplifier circuits given in FIGS. 3A and 3B can therefore be used to extract the digital signal in this case. In FIG. 3B, the value of $V_{CM}$ would be between a 0 and a 1, i.e., Vdd/2.

FIGS. 4A and 4B show sense amplifiers suitable for performing comparisons in a case when the Boolean function has more than one value. In this case, a complementary function F̲ is formed by applying the well-known DeMorgan rule to a Boolean function F. For instance, if F=AB, then F̲=A̲+B̲, in accordance with the DeMorgan rule. The sense amplifier of FIG. 4A implements these two Boolean functions. The left input leg circuit structure for F=AB corresponds to the series combination of m5 and m6. The corresponding result is found on the opposite side of the circuit. Similarly, the right input leg circuit structure for F̲=A̲+B̲ corresponds to the parallel combination of m7 and m8. Note that the inputs that are applied to this circuit must be complementary. For example, if A=1 and B=0, then A̲=0 and B̲=1. More particularly, in all four exhaustive combinations of the inputs A and B in this example, the inputs applied to one side of the circuit are the binary complement of those inputs applied to the other side. Thus, only one leg of the circuit is enabled at a particular time.

Transistors m1, m2, m3 and m4 in the circuits of FIGS. 4A and 4B are configured as in the circuits of FIGS. 3A and 3B. As noted above, the left input leg of each of the circuits in FIGS. 4A and 4B is comprised of transistors m5 and m6, each associated with a corresponding one of the inputs A and B, and the right input leg of each of the circuits is comprised of transistors m7 and m8. Note that transistors in parallel in the right leg translate to a series connection in the left leg, and vice versa, as a consequence of the DeMorgan rule. Also, note the inversion of the inputs from one side of the circuit to the other. Thus, the actual structure or connectivity of each side of the circuit is related to that of the other side through the DeMorgan rule. As a result, in order to operate the circuit, the inputs that are applied to each side must be complementary, as previously indicated. The structure of the transistor connectivity requires this relationship between the inputs.

The circuits of FIGS. 4A and 4B operate in substantially the same manner as the corresponding circuits of FIGS. 3A and 3B. However, since the inputs to transistors m5–m8 in the circuit of FIG. 4A are digital and follow the DeMorgan rule, one of the two evaluation legs, i.e., the left leg comprising m5 and m6 or the right leg comprising m7 and m8, will be fully enabled while the other will be fully disabled. This allows the output nodes to achieve full digital values and reduces the power dissipation of the circuits after evaluation.

The common mode technique can be applied to more complex Boolean functions, but generally becomes more difficult to predict as the function becomes more complex and the number of inputs increases. With reference to FIG. 4B, the gates of the devices in the right leg of the sense amplifier have the common mode voltage $V_{CM}$ applied to them. The widths of transistors m5 and m6 relative to the widths of transistors m7 and m8 can potentially cause this circuit to fail. However, by appropriately sizing the width of the transistors in the right leg to be less than that of the left leg, the circuit can be made to operate properly. Although not shown as such in the figure, a single device may be used to implement the two parallel transistors m7 and m8. Furthermore, the voltage applied to this single device can be Vdd instead of Vdd/2, although the width would need to be further decreased. The value of this voltage is constant at all times and of course the same for every evaluation.

Note the difference in the meaning of complementary signals in the digital and analog domains. In the digital domain, the two sets of inputs have a discrete number of input possibilities given by $2^n$, where n is the number of inputs in a given leg. For example, the inputs to the left leg the FIG. 4A circuit can be 00, 01, 10 or 11. In the analog case described in conjunction with FIG. 3A, the two inputs can have continuous values of $\Delta$ around the common mode voltage. In the special case of $\Delta$=Vdd/2 the analog sense amplifier operates as a digital sense amplifier.

In the above-described conventional analog comparators, at most only two analog inputs are compared at once. U.S. Pat. No. 6,191,623, issued Feb. 20, 2001 in the name of inventor T. J. Gabara and entitled "Multi-Input Comparator," and U.S. patent application Ser. No. 09/162,852, filed Sep. 29, 1998 in the name of inventors T. J. Gabara and S. A. Mujtaba and entitled "Multi-Input Comparator," both of which are incorporated by reference herein, describe comparator circuits having more than two inputs.

FIGS. 5A, 5B and 5C show example gate structures having complementary input structures. Referring to FIG. 5A, upper and lower transistor arrays comprising pairs of transistors m7, m8 and m5, m6, respectively, are formed using n-channel devices. Note that the complementary transistor array legs have opposite connectivity structures in that if one leg has parallel transistors, the other leg has its corresponding transistors arranged in series. Because of the use of complementary input structures, the inputs to the upper leg in FIG. 5A need to be inverted. FIG. 5B shows the FIG. 5A circuit configured with inverters to generate the inputs to the upper leg. The inverters and n-channel devices can be replaced with p-channel devices, resulting in the circuit of FIG. 5C. In each of the circuits of FIGS. 5A, 5B and 5C, an output $\underline{F}$ is generated at the output of an inverter as shown. The FIG. 5C circuit is an example of a CMOS AND gate, and adheres to the complementary transistor structure previously described. There is thus a simple one-to-one correspondence between the left and right legs of a sense amplifier as described in conjunction with FIG. 4A and respective top and bottom legs of the related static gate structure shown in FIG. 5C.

FIGS. 6A, 6B and 6C show additional examples of gate structures with complementary inputs. The circuit shown in FIG. 6A is a CMOS OR gate, comprised of transistors m5, m6, m7 and m8 and an inverter, in which inputs A and B each drive the capacitance of two gates. FIG. 6B shows the circuit that results if the two upper series p-channel transistors m7 and m8 driven by the A and B inputs are replaced by a single p-channel transistor m7 having its gate connected to ground. This circuit is analogous in certain ways to the circuit of FIG. 4B. As noted previously, instead of using the common mode voltage as in FIG. 4B, the applied voltage in this case can be Vdd. However, since m7 in FIG. 6B is a p-channel transistor, the applied voltage must be opposite in polarity, or Vss. Since this voltage is a constant at all times, the FIG. 4B and FIG. 6B circuits exhibit equivalent behavior.

By properly sizing of transistors, the FIG. 6B circuit can be configured to perform digital operations. This gate structure is known as a pseudo-NMOS gate and provides advantages in terms of increased throughput speed. However, the circuit can exhibit excessive power dissipation in that if either A or B is high, a resistive path forms between Vdd and ground. In this gate structure, a single upper device that is always enabled (m7 in FIG. 6B) replaces the complementary structure (m7 and m8 in FIG. 6A). Although the upper device is not being driven by either input signal A or B, its ground potential input is analogous to a common mode signal since its voltage is always constant.

FIG. 6C shows a modified circuit having a reduced power dissipation but substantially the same speed advantages of the FIG. 6B circuit. In the FIG. 6C circuit, a clock signal ck is used to enable each leg in alternate cycles. That is, when ck is low, the upper leg is enabled due to m7 which precharges node fout, while the lower leg is disabled due to the series transistor m1. When ck is high, the upper leg is disabled and the lower leg can be conditionally enabled depending on the values of A or B either pulling the node fout low or leaving it unaltered. Thus in this circuit, one can never have the situation where both legs are simultaneously enabled. The ck signal which is applied to both legs ensures this condition. When the circuit is evaluated, ck is high and during this time interval the voltage applied to m7 is a constant or Vdd. The FIG. 6C circuit, known as domino CMOS, is equivalent to the common mode circuit of FIG. 6B since the voltage applied to the m7 leg remains constant during evaluation.

Note that the common mode signal in the circuits of FIGS. 6B and 6C is essentially a constant during evaluation. The final Boolean result ultimately depends on the value of the input Boolean variables and not on the condition of the common mode leg. In other words, the common mode determines the balance point of the circuit but the final output is a function of the input variables.

FIGS. 7A, 7B and 7C illustrate digital comparator circuits of a type described in U.S. Pat. No. 4,767,949 issued Aug. 30, 1988 in the name of inventor W. T. Mayweather, III and entitled "Multibit Digital Threshold Comparator," which is incorporated by reference herein. The FIG. 7A circuit includes transistors m1–m10 and an inverter arranged as shown. The circuit as shown in FIG. 7A may appear to have non-complementary input structures in that the DeMorgan rule does not seem to be followed between top and bottom legs of the circuit. However, a decomposition of the FIG. 7A circuit as shown in FIGS. 7B and 7C illustrates that the input structures in the FIG. 7A circuit are in fact complementary.

FIG. 7B copies only the lower leg n-channels and forms the complementary upper leg circuit using the DeMorgan rule. That is, the series connection of m3 to the parallel combination of m1 and m2 is translated as m4 being in parallel with the series combination of m9 and m10. Finally, the parallel leg comprising the series combination of m7 and m8 translates into the series path comprising the parallel combination of m5 and m6.

Transistors m5 and m6 of FIG. 7B are then duplicated as respective transistor pairs m5, m5a and m6, m6a, and the line denoted "wire" in FIG. 7B is cut as shown in FIG. 7C. This wire can be cut because each path contains the influence of the signals X and Y. The path consisting of transistors m5a, m6a, m9 and m10 can be further simplified by removing transistors m5a and m6a since they are redundant. This simplification results in the circuit as shown in FIG. 7A, thereby confirming that this circuit in fact has complementary input structures.

As is apparent from the foregoing, conventional comparator circuits have complementary input structures configured for processing of complementary inputs. A need exists in the art for improvements in comparator circuits in terms of reduced power dissipation, transistor count and throughput delay relative to the conventional circuits.

SUMMARY OF THE INVENTION

The present invention provides comparator circuits having non-complementary input structures for use in performing comparisons and other related operations involving two or more input signals. These comparator circuits are referred to herein as non-complementary comparators. The input signals compared or otherwise processed in a given non-complementary comparator may but need not be non-complementary input signals.

In accordance with one aspect of the invention, a non-complementary comparator includes an evaluation element such as a memory cell, e.g., a random access memory (RAM) cell, a differential amplifier, or other type of circuit adapted to perform an evaluation function, and at least first and second input legs each coupled to a corresponding one of a first and second node of the evaluation element. The first and second input legs have non-complementary structures relative to one another, with each of the non-complementary structures having associated therewith a variable parameter, e.g., a variable resistance, variable current or variable voltage, having a value that is a function of a corresponding input signal. The evaluation element performs a comparison of at least first and second inputs applied to the respective first and second input legs. The input legs may each be implemented as a weighted array of transistors, with each of the transistors in the weighted array associated with a given leg corresponding to a particular bit or other portion of an input signal applied to that leg.

A non-complementary comparator in accordance with the invention may be used as a multi-digit comparator to determine the relative weight of digital words, or to implement other comparator circuits such as, e.g., majority rule circuits, analog common mode comparators, greater than/less than circuits, array addition and comparison circuits, serial adder-binary search (SA-BS) circuits, analog adders, add-compare-select (ACS) circuits, coupled memory cell comparators and comparators with mask functions.

Advantageously, the non-complementary comparators of the present invention can provide substantial reductions in power dissipation, transistor count and throughput delay in a wide variety of comparator-based circuits.

DETAILED DESCRIPTION OF THE INVENTION

The present invention will be illustrated herein using exemplary non-complementary comparators. The term "non-complementary comparator" as used herein refers to a circuit configured so as to include non-complementary input structures or to otherwise be able to compare two or more non-complementary input signals. The term "non-complementary input structures" refers to two or more input structures which are not implemented as Boolean complements of one another, e.g., are not implemented as complements of one another in accordance with the above-noted DeMorgan rule.

It should be understood, however, that the invention is suitable for use with circuit structures other than those specifically described herein. For example, the invention is applicable not only to comparator circuits based on sense amplifiers and differential amplifiers, but also to comparator circuits based on other types of circuit arrangements. In addition, as is apparent from the above definitions, the invention can be used to implement a comparator circuit having two inputs, three inputs, or more than three inputs. In the illustrative comparator circuits, supply voltage Vss is illustrated as ground, but can be a particular non-zero voltage level, as is well known. Also, those skilled in the art will recognize that the polarity of the transistor devices in a given circuit generally may be reversed, e.g., p-channel devices may be replaced with n-channel devices and vice versa. Moreover, the described circuits can be implemented using other transistor technologies, such as bipolar junction transistors (BJTs), GaAs transistors, and other technologies, as well as combinations thereof.

In accordance with one aspect of the present invention, a basic non-complementary comparator is provided. As will be described in detail below, the basic non-complementary comparator structure in an illustrative embodiment can be used to form multi-digit comparators that determine the relative weight of digital words, as well as other comparator circuits such as, e.g., majority rule circuits, analog common mode comparators, greater than/less than circuits, array addition and comparison circuits, serial adder-binary search (SA-BS) circuits, analog adders, add-compare-select (ACS) circuits, coupled memory cell comparators, and comparators with mask functions. Advantageously, the non-complementary comparators of the present invention can provide substantial reductions in power dissipation, transistor count and throughput delay in a wide variety of comparator-based circuits.

Isolation

As noted above, an important issue in conventional analog and digital sense amplifiers is whether the two legs are enabled simultaneously. It is also important to provide isolation of the comparator outputs from the evaluation legs.

Figure 1:
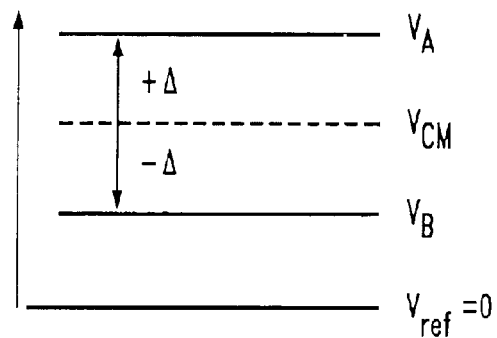
FIG. 1 is a diagram illustrating analog complementary voltages based on a common mode voltage.
Figure 2:
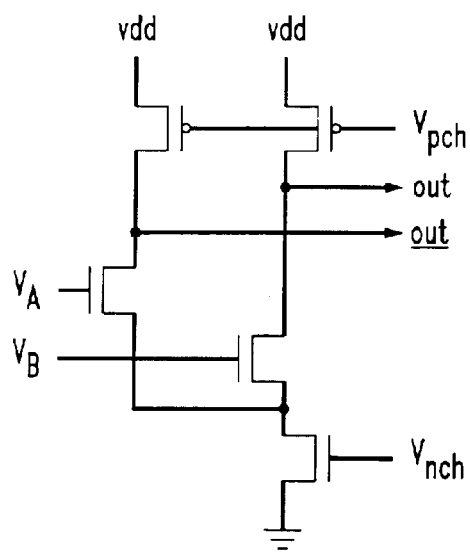
FIGS. 2A and 2B show conventional analog differential amplifiers.
Figure 2:
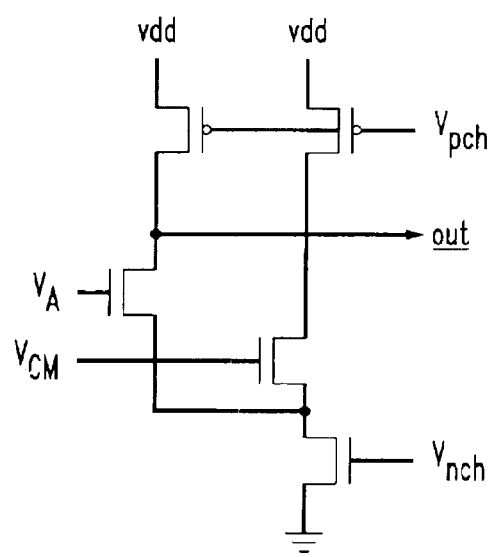
Figure 3:
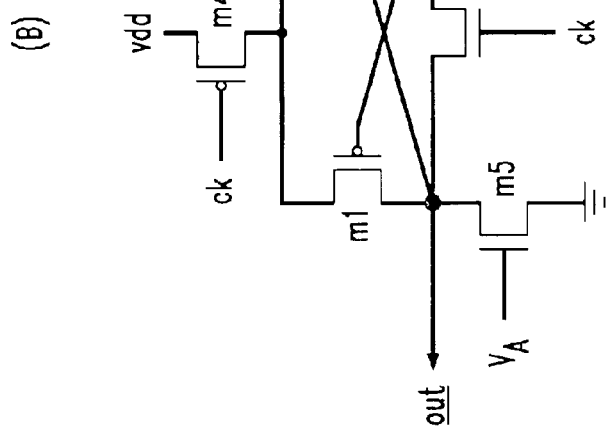
FIGS. 3A and 3B show conventional analog sense amplifiers.
Figure 3:
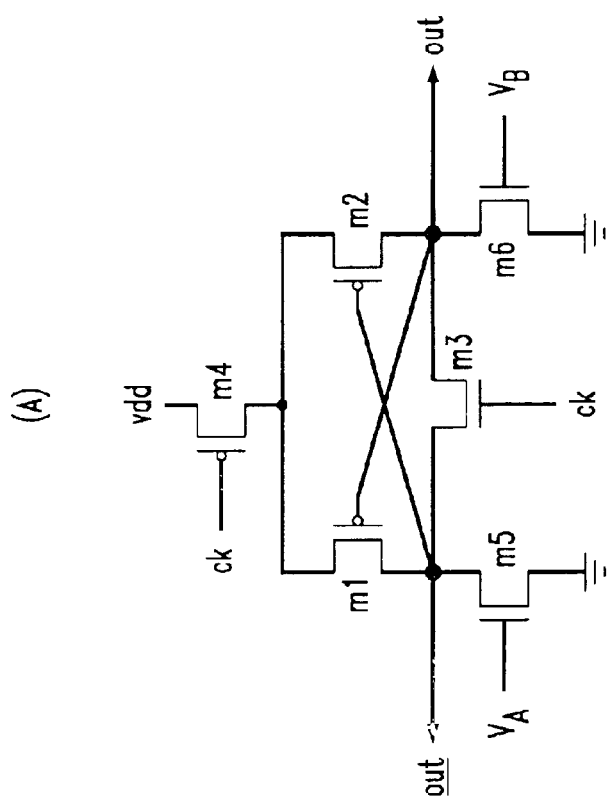
Figure 4:
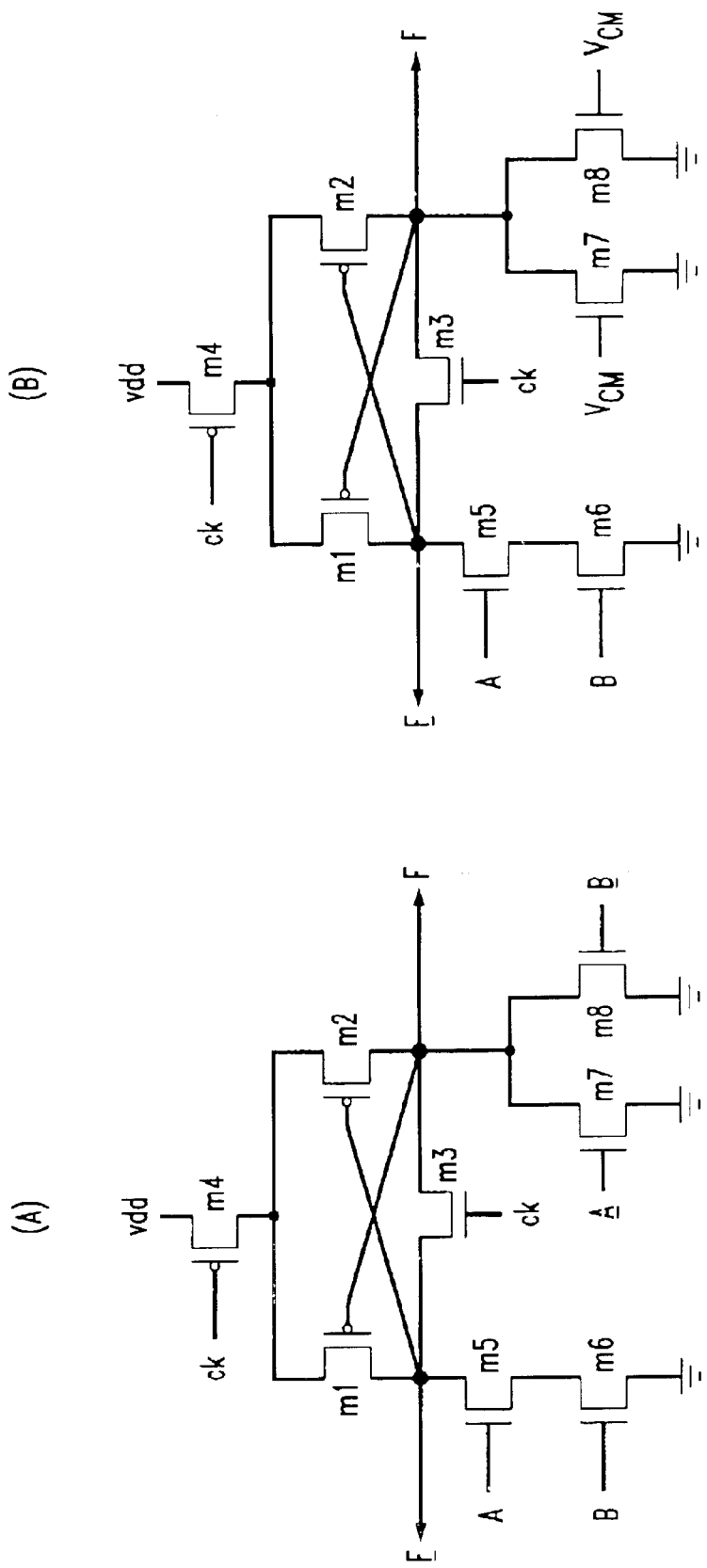
FIGS. 4A and 4B show conventional digital sense amplifiers.
Figure 5:
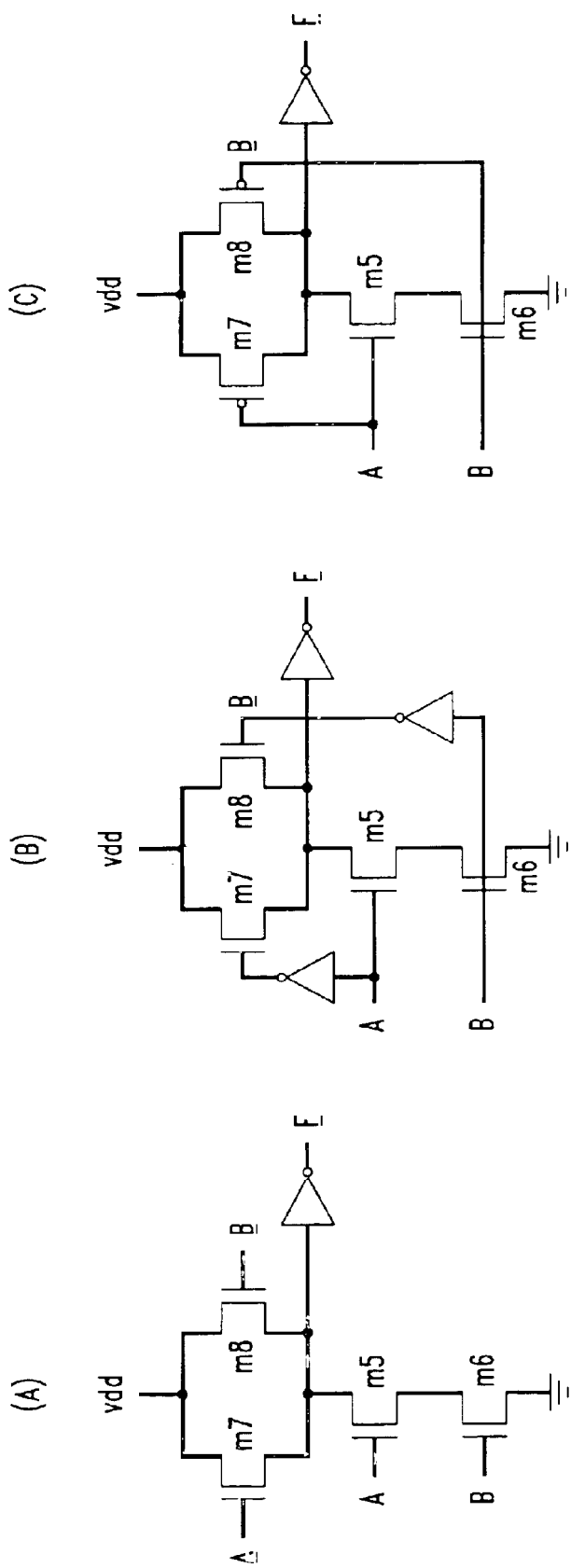
FIGS. 5A, 5B and 5C illustrate progression of a conventional complementary structure to a conventional static CMOS gate.
Figure 6:
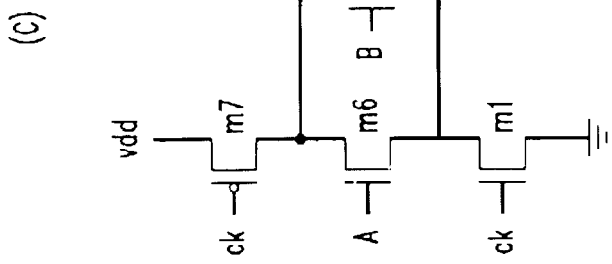
FIGS. 6A, 6B and 6C illustrate progression of a conventional OR gate to conventional pseudo-NMOS and domino gate structures.
Figure 6:
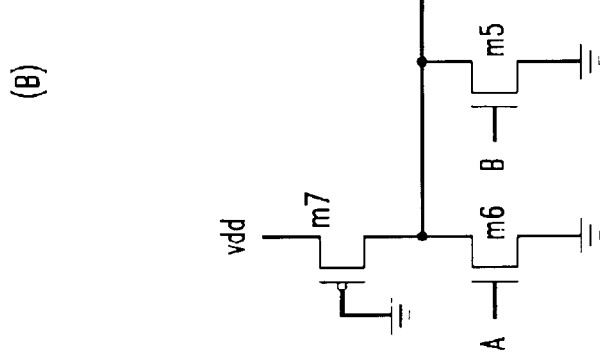
Figure 6:
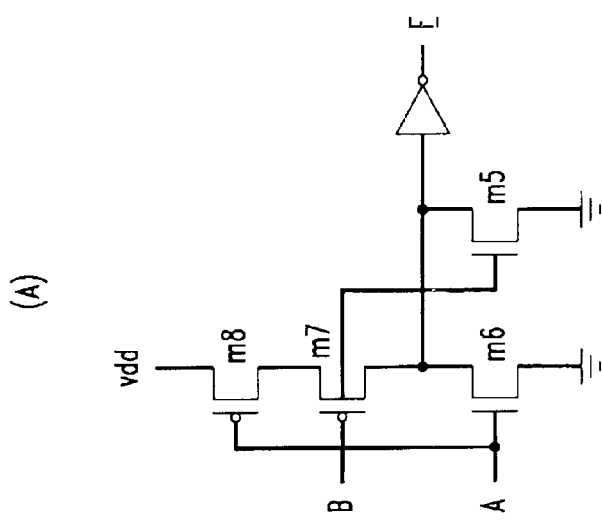
Figure 7:
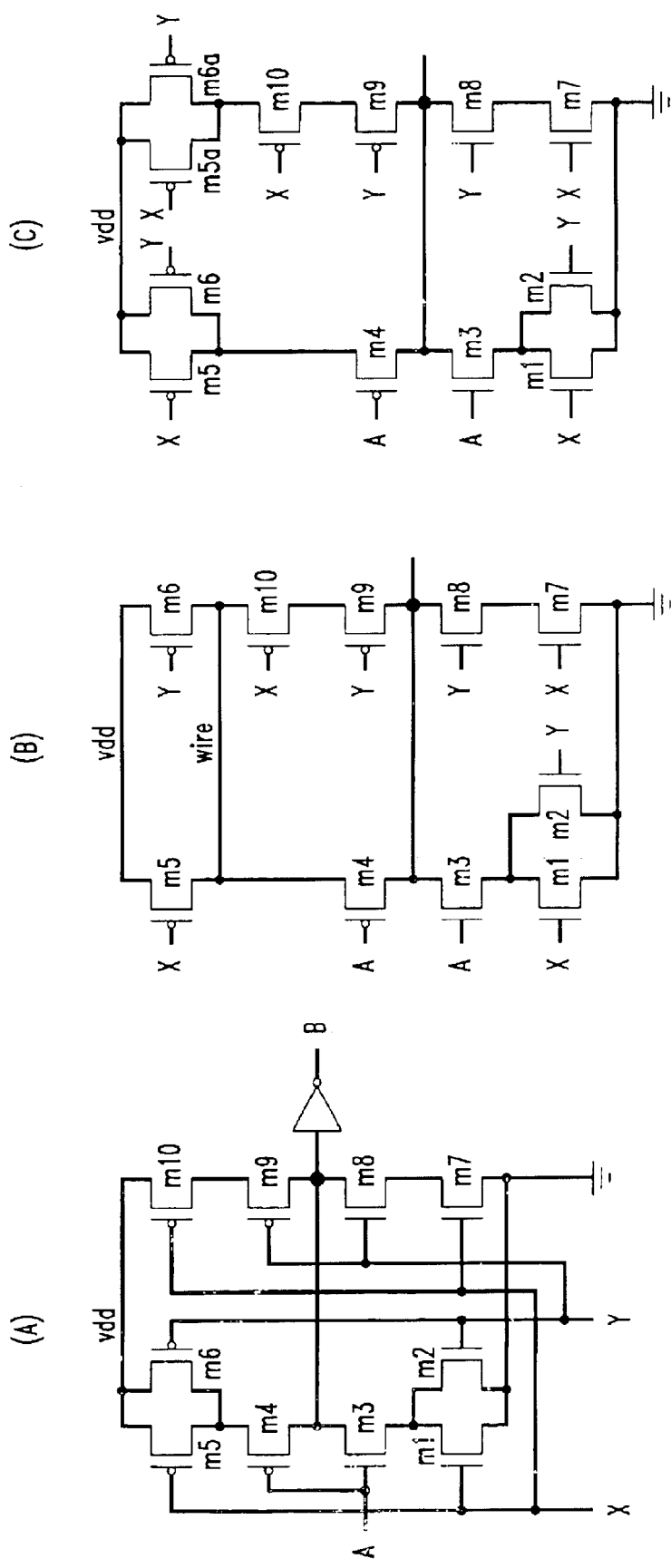
FIGS. 7A, 7B and C illustrate the complementary nature of a conventional logic gate.
Figure 8:
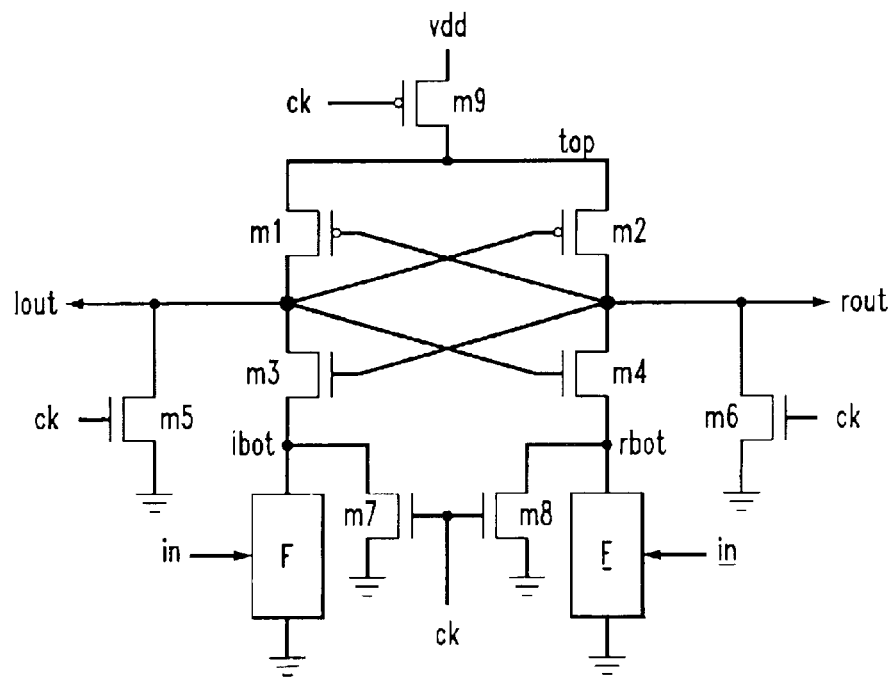
FIG. 8 shows an analog sense amplifier in accordance with the invention, in which amplifier outputs are isolated from evaluation legs after evaluation.

FIG. 8 shows an analog sense amplifier in accordance with the invention, having a left input leg F and a right input leg $\underline{F}$ which can both be enabled simultaneously. However, after evaluation, the outputs achieve full digital values and do not incur the power dissipation penalty as previously described in conjunction with FIGS. 3A and 3B. Transistors m1, m2, m3 and m4 form a cross-coupled random access memory (RAM) cell that compares the contents of the two legs F and $\underline{F}$ during evaluation. The transistors m3 and m4 also serve to isolate the output nodes lout and rout from the respective legs F and $\underline{F}$. so as to provide the isolation referred to above. The FIG. 8 circuit further includes transistors m5 through m9 arranged as shown.

Figure 9:
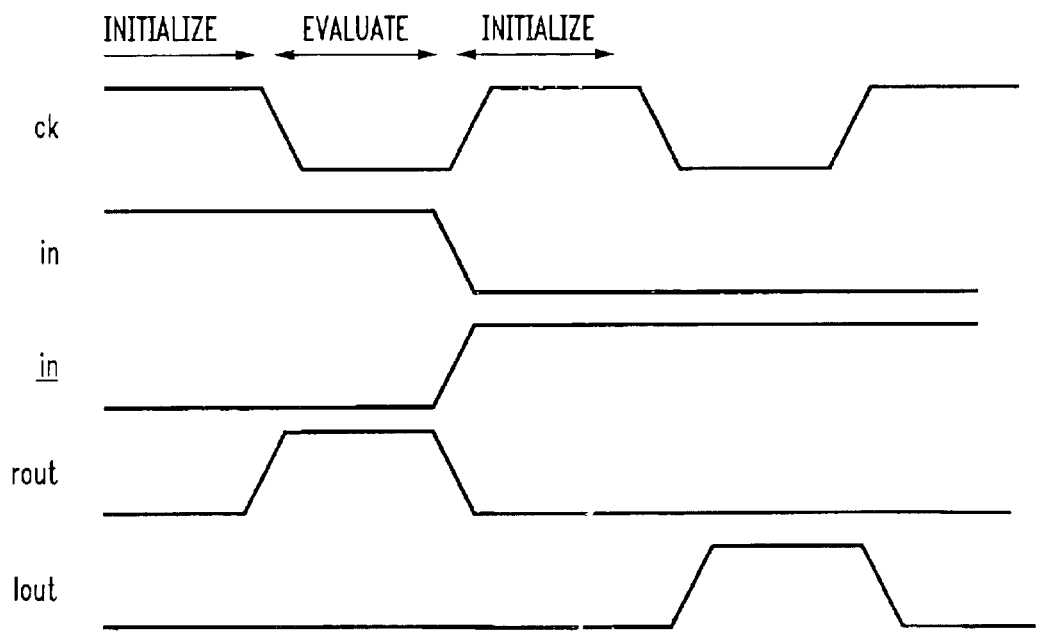
FIG. 9 is a timing diagram for the analog sense amplifier of FIG. 8.

FIG. 9 is a timing diagram for the FIG. 8 analog sense amplifier. The transistors m5 through m8 are used to initialize the RAM cell when clock signal ck is high. Nodes lout, lbot, rout and rbot are set to a Vss or ground potential during this interval. During evaluation, when ck is low, either lout or rout goes high depending on the relative values of input signals in and $\underline{in}$. Assume both input signals are fully digital, i.e., have values of Vdd or ground, such that the circuit operates as a digital sense amplifier. Note that because of the partition of the clock period into initialization and evaluation intervals, the output signal is valid only during the evaluation interval. To interface this sense amplifier circuit to standard logic circuitry, the output signals lout and rout can be applied to an RS flip-flop generating a signal that is constant over a full clock cycle. Other types of flip-flops or other circuitry can also be used to capture the data for a full clock cycle.

In general, there are two distinct types of isolation that are of particular importance in comparator circuits. The first type of isolation is the isolation of the comparator outputs from the evaluation legs, and was previously described in conjunction with the comparator circuit of FIG. 8. If the capacitive load at nodes lout and rout cannot be carefully balanced, a second type of isolation can be incorporated. This second type of isolation is the isolation of the comparator random access memory (RAM) cell or other evaluation element from the comparator outputs. Having both types of isolation in a comparator circuit can provide substantial benefits, including reduction of power dissipation and improved signal integrity. It should be noted, however, that this type of isolation may not be needed in certain circumstances, e.g., where one can ensure a substantially equal capacitive load at each output.

Figure 10A:
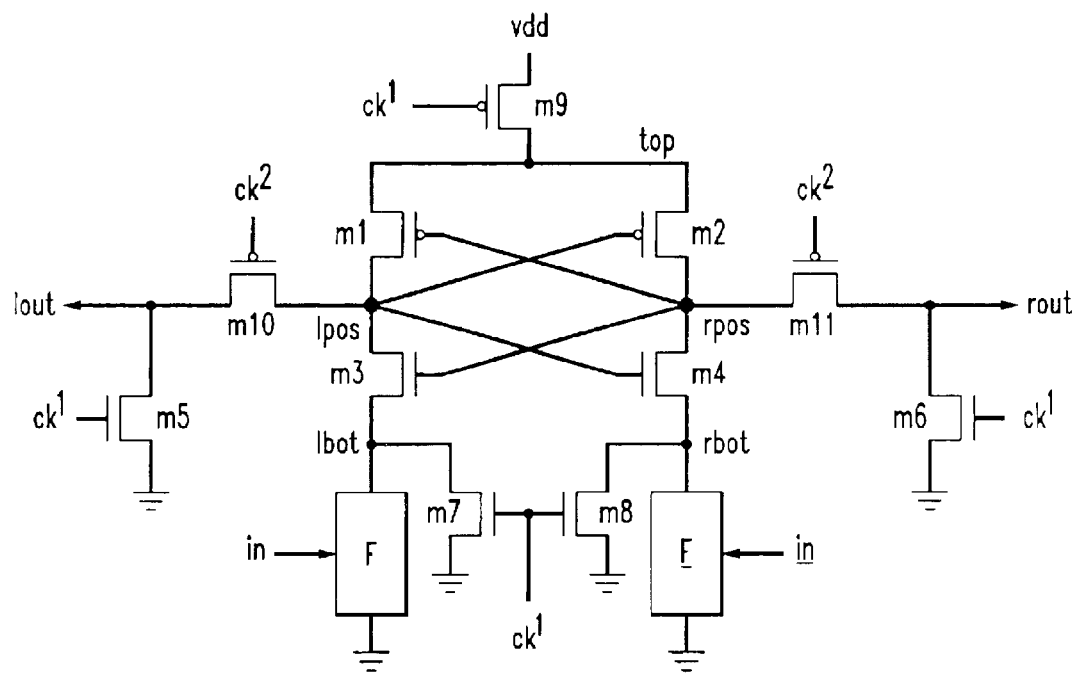
FIGS. 10A, 10B, 10C and 10D show analog sense amplifiers in which a RAM cell is isolated from the amplifier outputs in accordance with the invention.

FIG. 10A shows the FIG. 8 circuit modified with additional circuitry in accordance with the techniques of the invention to provide the second type of isolation referred to above. Transistors m10 and m11 isolate the evaluation of the nodes lpos and rpos from the outputs lout and rout. This is important because the evaluation of the RAM cell becomes independent of the possible asymmetry of the loads lout and rout. There are two clock signals $ck^1$ and $ck^2$ being applied to the circuit of FIG. 10A. Clock signal $ck^1$ is applied like clock signal ck in FIG. 8 to m5, m6, m7 and m8. Clock signal $ck^2$ is a delayed version of $ck^1$, and may be generated by tapping an inverter string or by other suitable means known in the art. The circuit of FIG. 10A also preferably includes two additional transistors (not shown) activated by $ck^1$ for initializing the nodes lpos and rpos to ground.

Figure 10B:
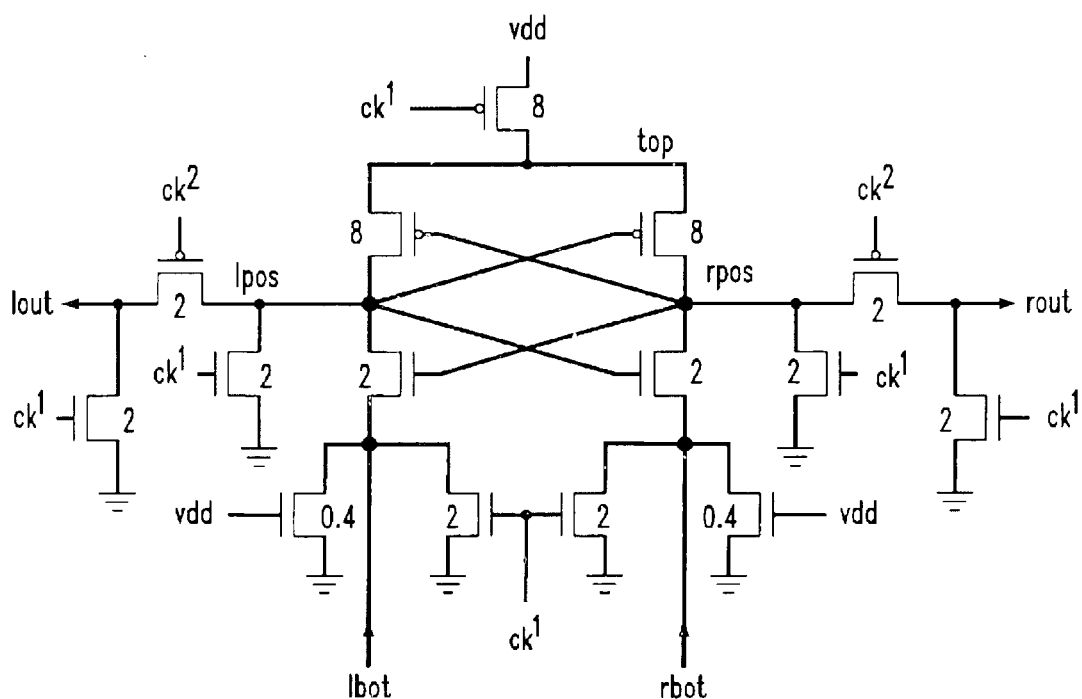

FIG. 10B shows an example implementation of the FIG. 10A circuit. The numbers adjacent the transistors in the FIG. 10B circuit denote transistor widths in micrometers ($\mu$m). In the FIG. 10B circuit, the two additional transistors connected to nodes lpos and npos are initialization transistors used to precharge these nodes to Vss (ground in this example) when $ck^1$ is high. One possible alternative configuration replaces these two initialization transistors with a single initialization transistor connected between the nodes lpos and npos and configured so as to equalize the voltage on these nodes during initialization.

There are also two additional transistors connected to nodes lbot and rbot. These two additional transistors have a width of 0.4 $\mu$m each and are permanently on via application of Vdd to the gates thereof. These two transistors give an equal effort to both sides of the circuit and when the gate structure that is connected to lbot and rbot comprises transistors in series, these two additional transistors help to account for charge sharing conditions. Charge sharing occurs when some of the serial paths are not fully enabled, but still provide a short current burst to the evaluation element due to parasitic capacitance in the enabled serial path being charged. By way of example, assume an input leg contains three series transistors and the two top ones are enabled. During evaluation, these two top transistors conduct charge to their parasitic capacitances, potentially triggering a false enablement of the path, since the third lower transistor is not enabled. Thus, the two enabled transistors as described previously help to add current to both sides of the circuit so as to mask the influence of this "false enablement" of the three transistor path.

Figure 10C:
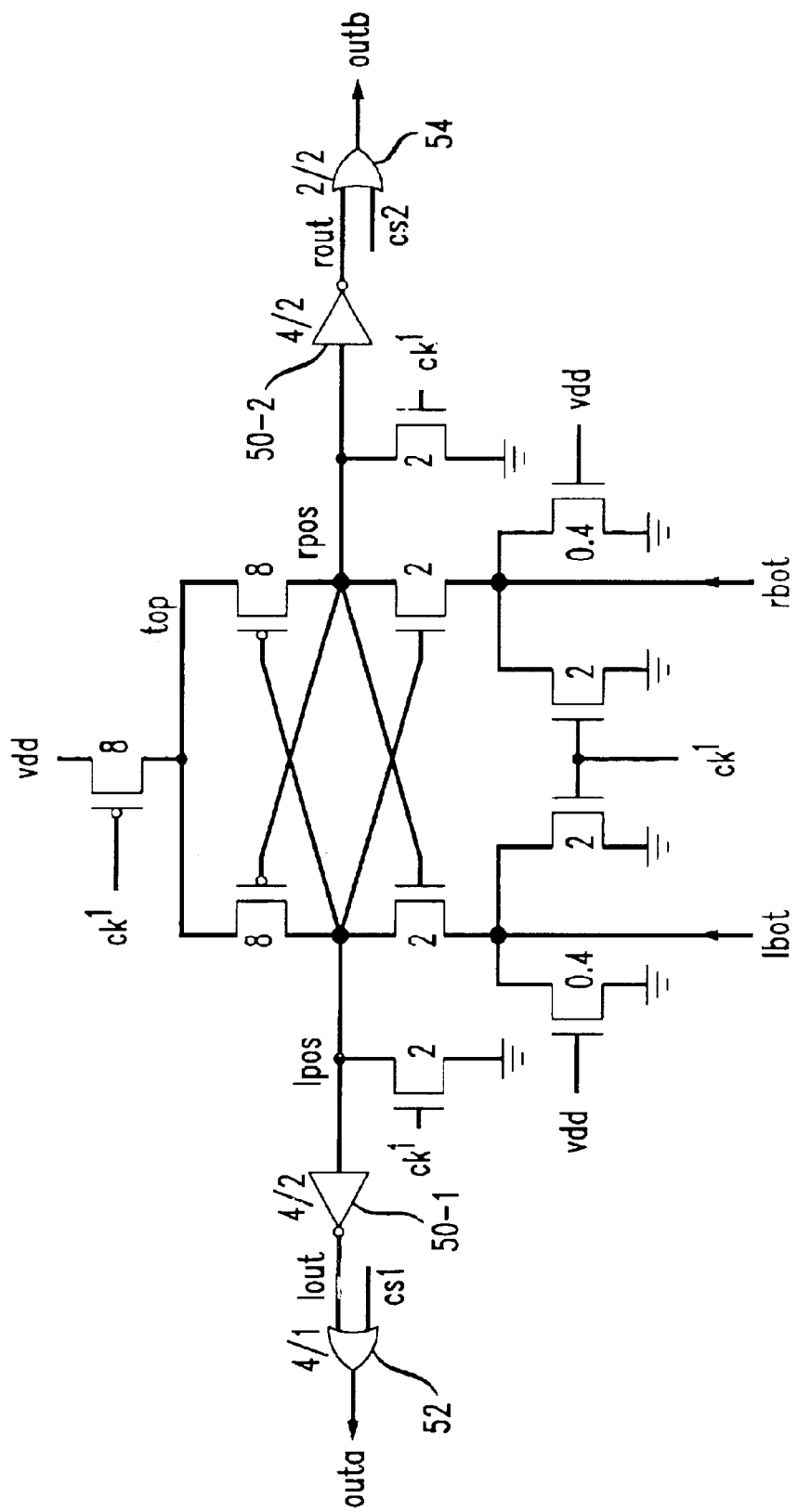

FIG. 10C shows the FIG. 10B circuit modified to incorporate logic circuitry at the evaluation cell outputs. Again, numbers adjacent transistors or other logic gates in the FIG. 10C circuit denote corresponding transistor widths in micrometers ($\mu$m). In this circuit, the left side output lout is generated at the output of an inverter 50-1 which has its input coupled to the node lpos. The right side output rout is generated at the output of an inverter 50-2 which has its input coupled to the node rpos. The lout and rout outputs are applied to NOR gate 52 and NAND gate 54, respectively. These gates also receive conditional signal inputs denoted cs1 and cs2, and generate outputs outa and outb, as indicated in the figure. The outputs outa and outb can be fed to other another comparator circuit or otherwise extracted for subsequent processing. The inverters 50-1 and 50-2 have equivalent sizes and therefore present a balanced capacitive load to the nodes lpos and rpos. The p-channel pass transistors clocked by $ck^2$ in the in FIG. 10B circuit are eliminated in the FIG. 10C circuit, thereby eliminating a clock delay.

It should emphasized that the particular arrangements shown in FIGS. 10A, 10B and 10C are exemplary only. Those skilled in the art will recognize that numerous other arrangements are possible using the techniques of invention.

It should also be understood that numerous other initialization techniques may be used, as will be apparent to those skilled in the art. In the remaining circuits described herein, initialization circuitry will typically not be shown for simplicity and clarity of illustration.

Equalization

Figure 10D:
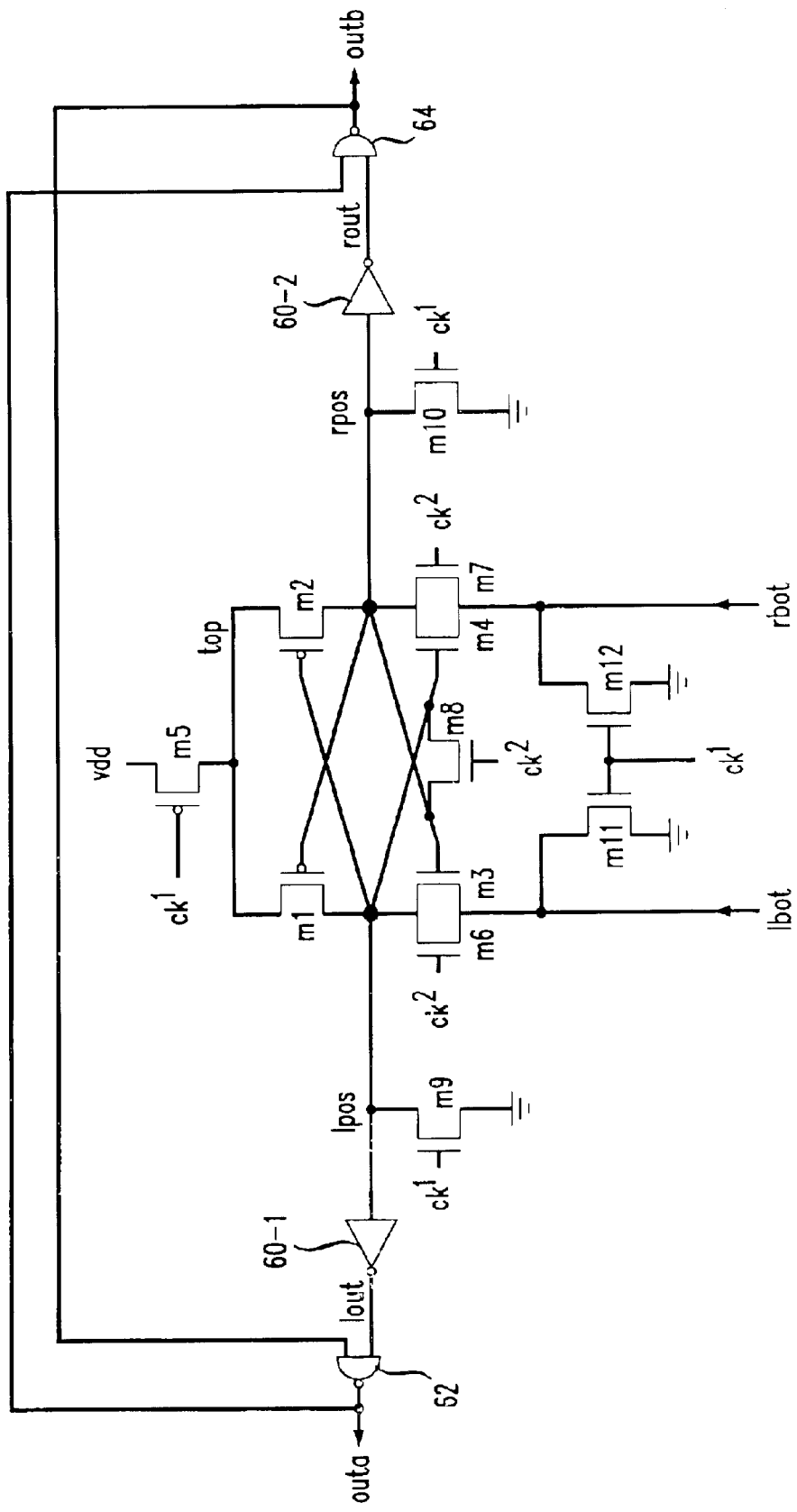

FIG. 10D shows a modified version of the FIG. 10C circuit specifically configured to address capacitance imbalance or mismatch between the nodes lpos and rpos. This capacitance imbalance can occur inadvertently during physical layout, e.g., when the circuit is implemented in silicon. The FIG. 10D circuit is designed to be more robust to this type of layout-related mismatch, through the inclusion of additional transistors m6, m7 and m8 as shown. The FIG. 10D circuit further includes RAM cell transistors m1–m4 as previously described, transistors m9, m10, m11 and m12 arranged as shown, inverters 60-1 and 60-2, and two-input NAND gates 62, 64. Outputs of the inverters 60-1 and 60-2 are connected to first inputs of the respective NAND gates 62, 64. In addition, an output of each one of the NAND gates is connected back to a second input of the other NAND gate as shown.

The additional transistors m6–m8 are each clocked by the clock signal $ck^2$. Since $ck^2$ is a slightly delayed version of $ck^1$, when $ck^1$ decreases to Vss, $ck^2$ will still be at a potential near Vdd. Therefore, when the RAM cell becomes enabled via transistor m5, transistors m6–m8 are still enabled. The transistors m6–m8 thus attempt to maintain an equalized potential at nodes lpos and rpos, thereby substantially canceling the effect of capacitance imbalance between nodes lpos and rpos. In addition, because the RAM cell is being enabled during this time period via m5, the regenerative capabilities of the RAM cell are increasing. Also during this period, the variable parameters of the evaluation legs are being sensed at nodes lpos and rpos via transistors m6 and m7. Note that transistors m3 and m4 may not be enabled yet since the potential at nodes lpos and rpos may be below the threshold voltage(s) of these devices. However, because m6 and m7 are enabled, the parameters of the legs at lbot and rbot can be transferred to nodes lpos and rpos while the RAM cell is being enabled.

The additional transistors m6–m8 in the FIG. 10D circuit thus serve the following two functions: (1) to transfer information associated with the variable parameters of the evaluation legs to the RAM cell; and (2) to equalize any capacitance imbalance at the nodes lpos and rpos of the RAM cell.

Again, the FIG. 10D circuit is shown by way of example, and other configurations may be used to achieve the desired results.

Non-complementary Function Evaluation

Figure 11:
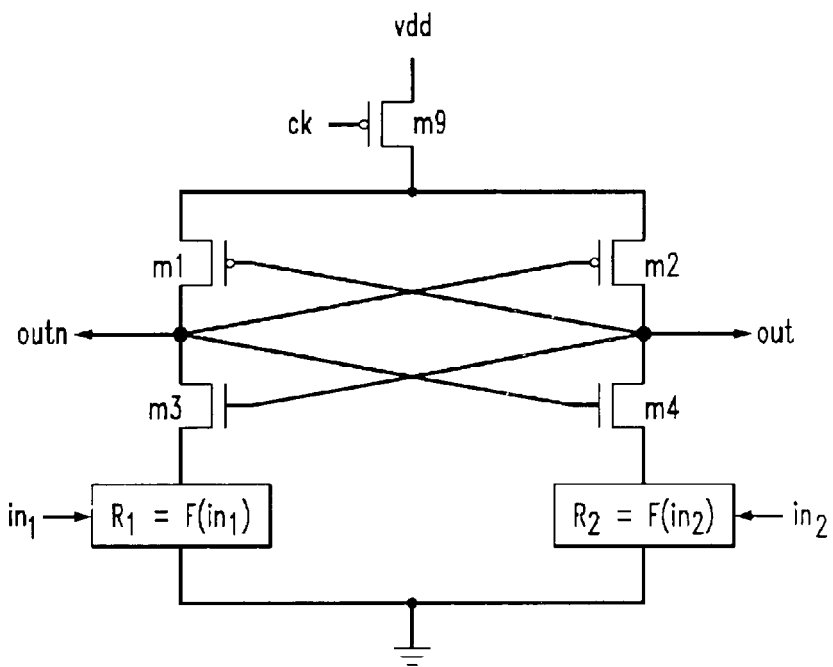
FIG. 11 shows an illustrative embodiment of a two-input non-complementary comparator in accordance with the invention.

FIG. 11 shows a basic non-complementary comparator circuit in accordance with an illustrative embodiment of the invention. The basic comparator in this illustrative embodiment is in the form of a digital sense amplifier, but could be configured in other forms, as will be apparent to those skilled in the art. The circuit includes a cross-coupled RAM cell formed of transistors m1, m2, m3 and m4. Initialization transistors such as m5 through m8 of FIGS. 8 and 10A may be included but are not shown in the figure. A clock signal ck is applied to transistor m9 and controls the application of Vdd to the RAM cell as in the circuits of FIGS. 8 and 10A.

Inputs $in_1$ and $in_2$ are applied to evaluation legs denoted as $R_1$ and $R_2$ respectively. As previously noted, evaluation legs are also referred to herein as input legs. In accordance with the invention, these legs have input structures which are non-complementary relative to one another, and therefore do not behave as conventional digital circuit structures. The input legs are coupled to nodes of the RAM cell, e.g., nodes out and outn in this illustrative circuit. In the illustrative circuit, the nodes to which the evaluation legs are coupled are on opposite sides of the cell, but this particular type of configuration is not a requirement of the invention.

The evaluation legs in the basic comparator circuit of FIG. 11 are viewed as variable resistances during evaluation. More particularly, the variable resistance associated with left leg $R_1$ is a function of input $in_1$ and the variable resistance associated with right leg $R_2$ is a function of input $in_2$, as is shown in the figure. The outputs out and outn of the FIG. 11 comparator circuit are a function of the variable resistances as follows:

If ($R_1$<$R_2$), the circuit will evaluate to out=1 and outn=0.

If ($R_1$>$R_2$), the circuit will evaluate to out=0 and outn=1.

In this embodiment, the evaluation occurs when the clock signal ck goes low, although this is of course by way of example and not a requirement of the invention.

The FIG. 11 comparator circuit by virtue of the variable resistances $R_1$ and $R_2$ is able to compare input signal $in_1$ against input signal $in_2$, even though in, may not be the complement of $in_2$. In other words, if the binary weight of $in_1$ is greater than the binary weight of $in_2$, $R_1$<$R_2$ and out=1, thereby indicating that $in_1$>$in_2$. As noted previously, conventional comparators are generally unable to process non-complementary inputs in this manner. The variable resistances may be implemented using weighted arrays of transistors, as will be described below.

A non-complementary comparator configured in a manner such as that shown in FIG. 11 may also be referred to herein as "seesaw" logic.

Although the FIG. 11 circuit and other illustrative embodiments of the invention utilize a RAM cell as an evaluation element, the invention can also be used with other types of memory cells, as well as other types of evaluation elements. The use of a RAM cell is therefore by way of example only, and should not be construed as limiting the invention in any way. The term "evaluation element" as used herein is intended to include a memory cell, a cross-coupled differential amplifier, other types of differential amplifiers, as well as other circuits capable of performing evaluations of the type described herein in conjunction with the illustrative embodiments.

It should be noted that a given evaluation element in accordance with the invention need not itself be capable of performing a comparison. For example, a sampling circuit may be used to evaluate variable parameters associated with input legs by sampling the variable parameters. The resulting samples can then be further processed in other local or remote circuitry to extract relationship information from the samples. Such sampling circuit based implementations of the invention are considered to be comparator circuits as the term is used herein.

The variable resistances used in the FIG. 11 circuit and other illustrative embodiments of the invention are shown by way of example only. Other embodiments of the invention can utilize other types of variable parameters, such as variable currents, variable voltages, etc. For example, in an embodiment of the invention implemented using BJTs, the variable parameter may be a variable current associated with each of the input legs.

The illustrative circuit configuration shown in FIG. 11 has certain power reduction aspects. Note that the FIG. 11 circuit includes a switch (transistor m9), the RAM cell (transistors m1–m4) and the evaluation legs. This ordering is important since a bottom node of each of the evaluation legs is at a constant potential, in this case Vss or ground, and therefore does not change potential during the operation of the cell. Thus, the alternating current (AC) power dissipation associated with these nodes is zero. Secondly, the variable parameter values associated with the evaluation legs are transferred to nodes outn and out via respective transistors m3 and m4. Because the capacitance at the top nodes of the evaluation legs can be large, the potential at these nodes may not vary much. Thus, this leads to a second reduction in power.

Figure 12:
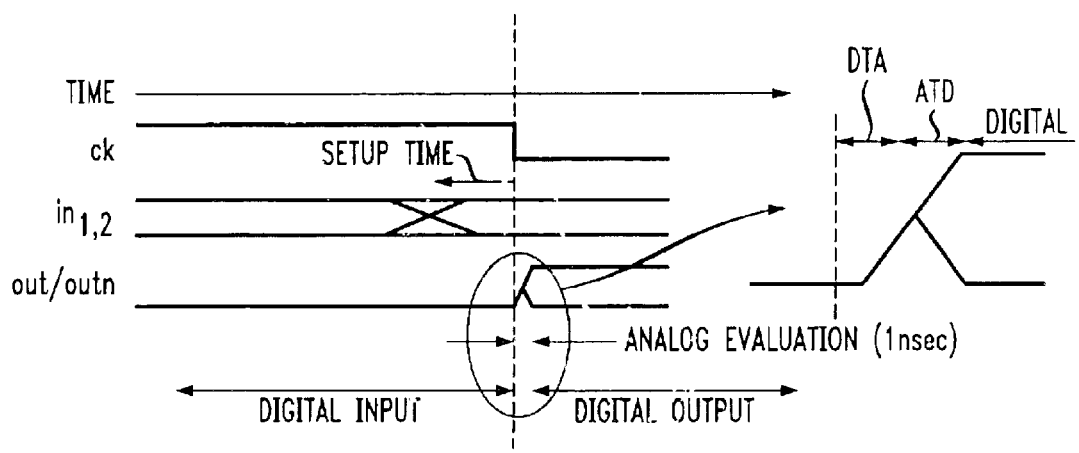
FIG. 12 is a timing diagram for the non-complementary comparator of FIG. 11.

FIG. 12 shows a timing diagram for the FIG. 11 circuit, and includes waveforms for the clock signal ck, the inputs $in_1$ and $in_2$, and the outputs out and outn. The input signals $in_1$ and $in_2$ need to meet a setup time requirement with regard to the falling edge of ck as shown in the timing diagram. The inputs and outputs in this embodiment are fully digital, except during the analog evaluation. Once the ck signal goes low to evaluate the RAM cell, the input digital values are translated into analog components inside the cell. This is illustrated in the figure as digital-to-analog (DTA) conversion. The analog components are evaluated, compared and translated back into digital output values, as shown by analog-to-digital (ATD) conversion in the figure. It can be shown that the DTA and ATD operations together take less than 1 nsec for a 9-bit word comparison in an implementation in which in1 and in2 are each 9-bit digital words. The final outputs out and outn after evaluation are fully digital.

It should be noted that the FIG. 11 circuit may be configured so as to utilize the additional transistors which are controlled by the clocks $ck^1$ and $ck^2$ in the manner previously described in conjunction with FIGS. 10A and 10B.

Figure 13:
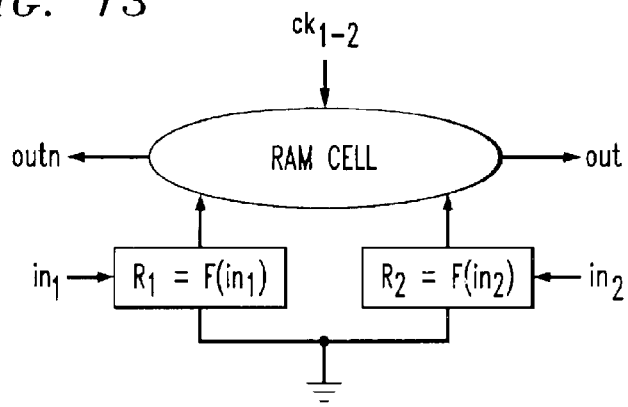
FIG. 13 is a simplified diagram of the non-complementary comparator of FIG. 11.

FIG. 13 shows a simplified illustration of the FIG. 11 circuit in which transistors m1–m4 and m9 are replaced with an element labeled "RAM cell." This RAM cell element will be used in subsequent figures for further simplification. As noted previously, the RAM cell is only one example of a type of evaluation element that may be utilized in conjunction with the invention, and other types of memory cells, differential amplifiers, sampling circuits or other circuits capable of performing an evaluation function may be used. The simplified circuit is assumed to be configured so as to utilize the dual clocks $ck^1$ and $ck^2$ of FIGS. 10A–10D. This dual clocking is indicated by the clock input $ck_{1-2}$ shown as being applied to the RAM cell in the figure.

Although illustrated in the context of a digital sense amplifier, the comparator of FIG. 11 can be used in both the analog and digital domains. More particularly, although well suited for use in comparing multi-bit digital words, the basic comparator can also be used to form other comparator circuits, such as, e.g., majority rule circuits, analog common mode comparators, greater than/less than circuits, array addition and comparison circuits, serial adder-binary search (SA-BS) circuits, analog adders, add-compare-select (ACS) circuits, coupled memory cell comparators, and comparators with mask functions. Examples of these other circuits will be described in detail below.

Weighted Arrays

Figure 14:
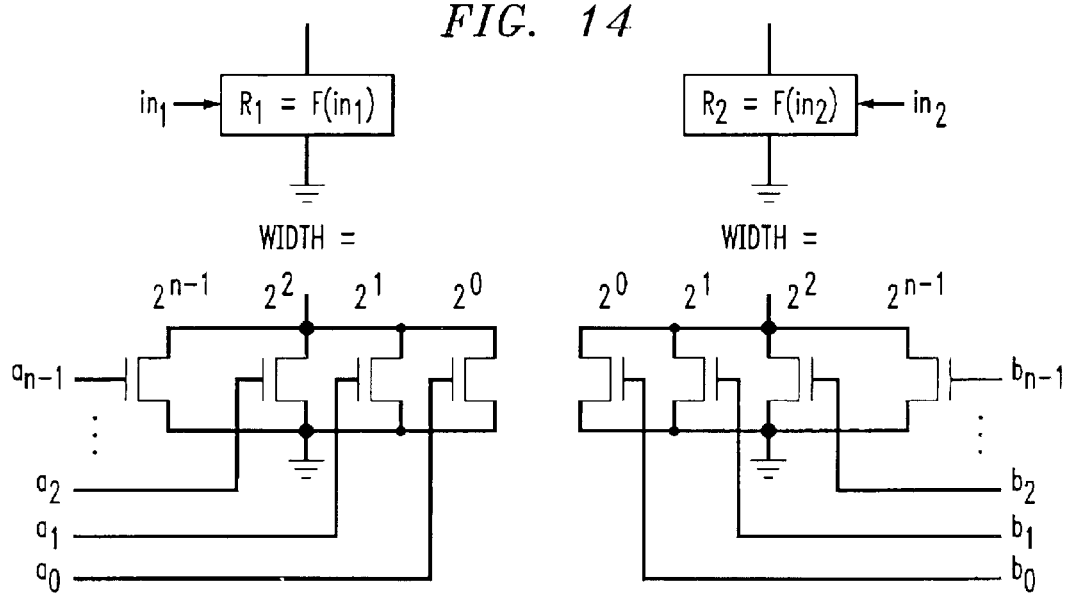
FIG. 14 illustrates the manner in which weighted arrays may be used to implement evaluation legs of the FIG. 11 comparator.

FIG. 14 illustrates the manner in which each of the evaluation legs of the FIG. 11 circuit can be implemented as a weighted array of transistors. In this figure, the input $in_1$ is an n-bit digital word A=$a_0$, $a_1$, $a_2$, ... $a_{n-1}$ and the input $in_2$ is a n-bit digital word B=$b_0$, $b_1$, $b_2$, ... $b_{n-1}$. The cross-coupled RAM cell is not shown. Within a given evaluation leg, each of the bits of a given multi-bit input word is applied to the gate of a corresponding transistor. The widths of the transistors are sized in accordance with the significance of their corresponding bits, i.e., the transistor corresponding to the most significant bit (MSB) $a_{n-1}$ of the input word A is associated with the $2^{n-1}$ width, while the transistor corresponding to the least significant bit (LSB) $a_0$ of the input word A is associated with the $2^0$ width. The transistors of the weighted array associated with input word B are sized in a similar manner.

Although shown in FIG. 14 as being formed of N-type transistors with digital weighting, the arrays in other embodiments may be formed using a variety of other transistor configurations, types, and sizes. More particularly, the arrays can be weighted digitally, linearly or as a combination of the two, the transistors can be in parallel, in series or a combination of the two, the transistor types can be N, P or a combination of both, and bipolar transistors or other types of devices can be used in place of MOS transistors.

It should also be noted that the weighting may be accomplished by using a single transistor of a given width as the lowest weighted device in a given array, and then using parallel combinations of the transistor of the given width to implement the larger weighted devices. For example, the $2^0$ device in the left array of FIG. 14 may be implemented as a single transistor of a given width, with the $2^1$ device being implemented as a parallel combination of two of the transistors of the given width, the $2^2$ device being implemented as a parallel combination of four of the transistors of the given width, and so on. Similar weighting techniques can be implemented in conjunction with the other weighted arrays described herein.

The example weighted array structure of FIG. 14 can compare the strengths of the two n-bit digital input words A and B. For example, assume n=8 and the input A=10101010 while B=10101011. Since B>A, the right array resistance $R_2$ will be less than the left array resistance $R_1$, such that the circuit in FIG. 13 will evaluate to out=0 and outn=1.

If both inputs A and B are equal, the weighted arrays indicate a tie and the output of the circuit may have either a "1" or "0" value after being evaluated. This is also known as a "metastable" condition. In some applications, this uncertainty is acceptable. In other applications, knowledge of equality is important and the circuit behavior should remain consistent after evaluation to ensure a consistent output. This issue can be addressed by incorporating an offset capability into each of the arrays, as will be illustrated in conjunction with FIG. 15, or by using a string of exclusive-or (XOR) gates to indicate that an equality condition has occurred, or by other suitable techniques.

Figure 15:
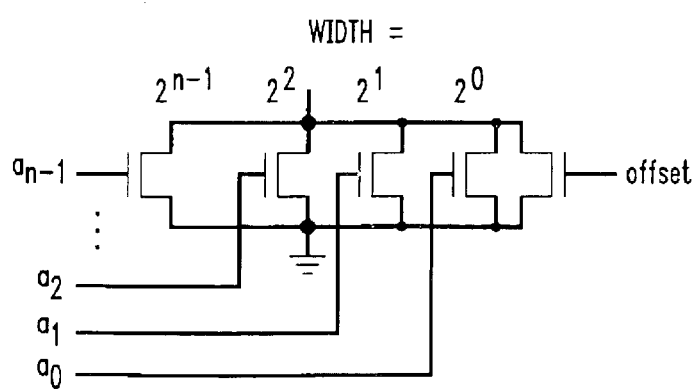
FIG. 15 illustrates the manner in which an offset can be added to a given one of the weighted arrays of FIG. 14.

FIG. 15 shows the left array associated with n-bit input A including an offset capability. A signal offset is applied to a gate of an additional transistor in the weighted array. This additional transistor has a width corresponding to a digital weighting of less than $2^0$, in this case corresponding to a digital weighting of $2^{-1}$. The width of the additional transistor in this embodiment is thus one-half that of the next smallest transistor in the array, i.e., the transistor associated with the $2^0$ weighting.

It should be noted that, in certain applications, the offset transistor can have the same or smaller width than that of the transistor associated with the $2^0$ weighting but may also or alternatively have a gate length that is longer than that of the $2^0$ transistor, such that its resulting behavior will provide the desired offset function. In other words, by appropriate selection of parameters such as gate length, the behavior of the offset transistor may be made to approximate that of a device weighted by $2^{-1}$ in width even though its actual width may be substantially the same as that of the $2^0$ transistor.

The signal offset for one or both of the weighted arrays can be set to a constant potential or may have been generated in a previous operation. If it is a constant potential, e.g., left array offset=Vdd, right array offset=0, then in a tie, the left array will always have the lower resistance. Other combinations of offset signal values can also be used to ensure that a particular array "wins" if the A and B inputs are equal. Even in the case where both A and B inputs are zero, the offset ensures that the output of the comparator circuit will not be indeterminate.

The other above-noted solution of using a string of XOR gates follows the conventional configuration of a parity check. It looks for the case where all comparable bits are equal and gives a single digital value indicating that such is the case. This is generally a more costly operation in terms of area and power dissipation.

In weighted arrays such as those shown in FIG. 14, the lowest digital weight determines the sensitivity of the arrays. However, when n is large, e.g., greater than or equal to 32, the lowest digital weight may be so small as to be indistinguishable from noise. It may therefore be desirable to partition a given array into a number of smaller arrays in a pipelined fashion.

Figure 16:
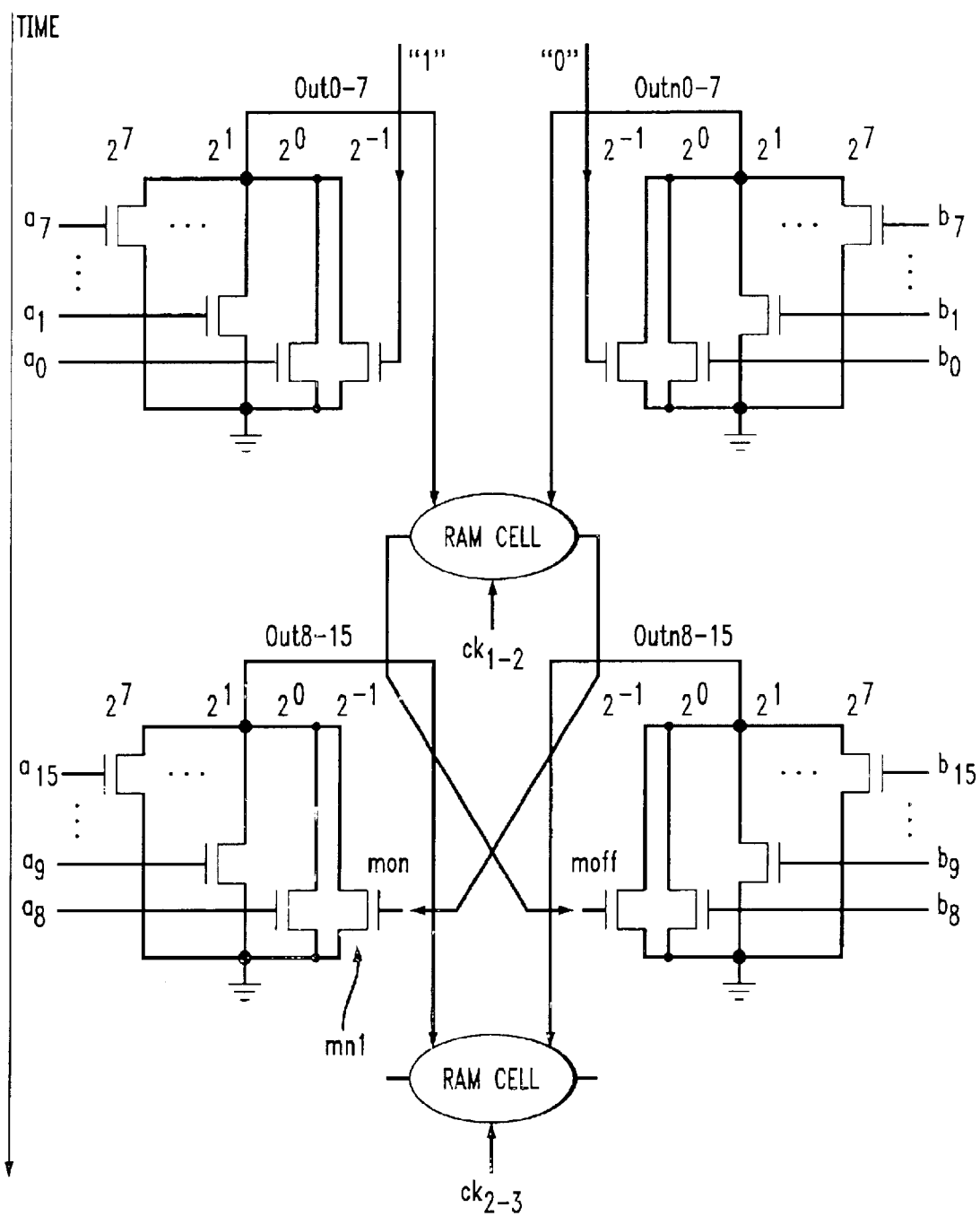
FIG. 16 illustrates the partitioning and pipelining of weighted arrays in a comparator in accordance with the invention.

FIG. 16 shows an example of such a pipelined array for a 32-bit comparator. The 32-bit comparator includes four 8-bit comparator stages arranged in a pipelined manner. Only the first two of the stages are shown in the figure. In this example, each of the left and right arrays of a given 8-bit comparator includes eight transistors associated with digital weighting $2^7$ through $2^0$ and an additional offset transistor associated with a weight of $2^{-1}$. For the first stage of the pipeline, eight input bits $a_0, a_1, a_2, \ldots a_7$ are applied to the eight transistors of the left array and eight input bits $b_1, b_2, \ldots b_7$ are applied to the eight transistors of the right array. Also, the left offset in the first stage is set to a "1" while the right offset in this stage is set to a "0." In the case of a tie, the left array will win. Once this stage is evaluated by the first stage RAM cell, its results are forwarded to the next pair of offset transistors in the next stage.

Note that the outputs of the first stage RAM cell are flipped before being applied to the next stage. By way of example, assume that $a_{0-7}=b_{0-7}$. Because of the above-described offset arrangement, the left array output out0-7 will go low. The output mon of the first stage RAM cell will go high and send the information from the previous stage to transistor mn1. This indicates that the $a_{0-7}$ inputs are larger than the $b_{0-7}$ inputs. The output moff of the first stage RAM cell at this time is low and is applied to a corresponding transistor of the right array of the second stage.

At the next stage of the pipeline eight input bits $a_8, a_9, \ldots a_{15}$ are applied to the eight transistors of the left array and eight input bits $b_8, b_9, \ldots b_{15}$ are applied to the eight transistors of the right array, and so on for the remaining stages of the pipeline (not shown).

The offset signal from a given pipeline stage passes to the next pipeline stage and provides an indication as to which array is "winning" within a given stage. In this manner, a 32-bit comparator can be implemented by a four-stage pipeline of 8-bit comparisons configured in the manner illustrated in FIG. 16, with each stage having a sensitivity of 1 out of 512. The sensitivity is thus determined by the number of bits in each stage, rather than the total number of bits that are compared over all stages. This pipelining approach also decreases the area requirements of the circuit. More particularly, the pipelining rescales the weighted transistors, such that the $32^{nd}$ input bit is applied to a device with weighting factor of $2^8=256$ instead of $2^{32}=4\times10^9$. However, as a result of the four-stage pipeline it will take four delays of the clock signal to generate a final output in this example.

Pipelined Structures

Pipelining of the type described generally in conjunction with FIG. 16 may be implemented using a number of different pipelined structures, including an N-tree to N-tree structure that will be described in conjunction with FIG. 17 and an N-tree to P-tree structure that will be described in conjunction with FIG. 18. The terms "N-tree" and "P-tree" indicate that the weighted arrays of the evaluation legs of the corresponding comparator stages are formed using respective n-channel and p-channel transistors.

Figure 17:
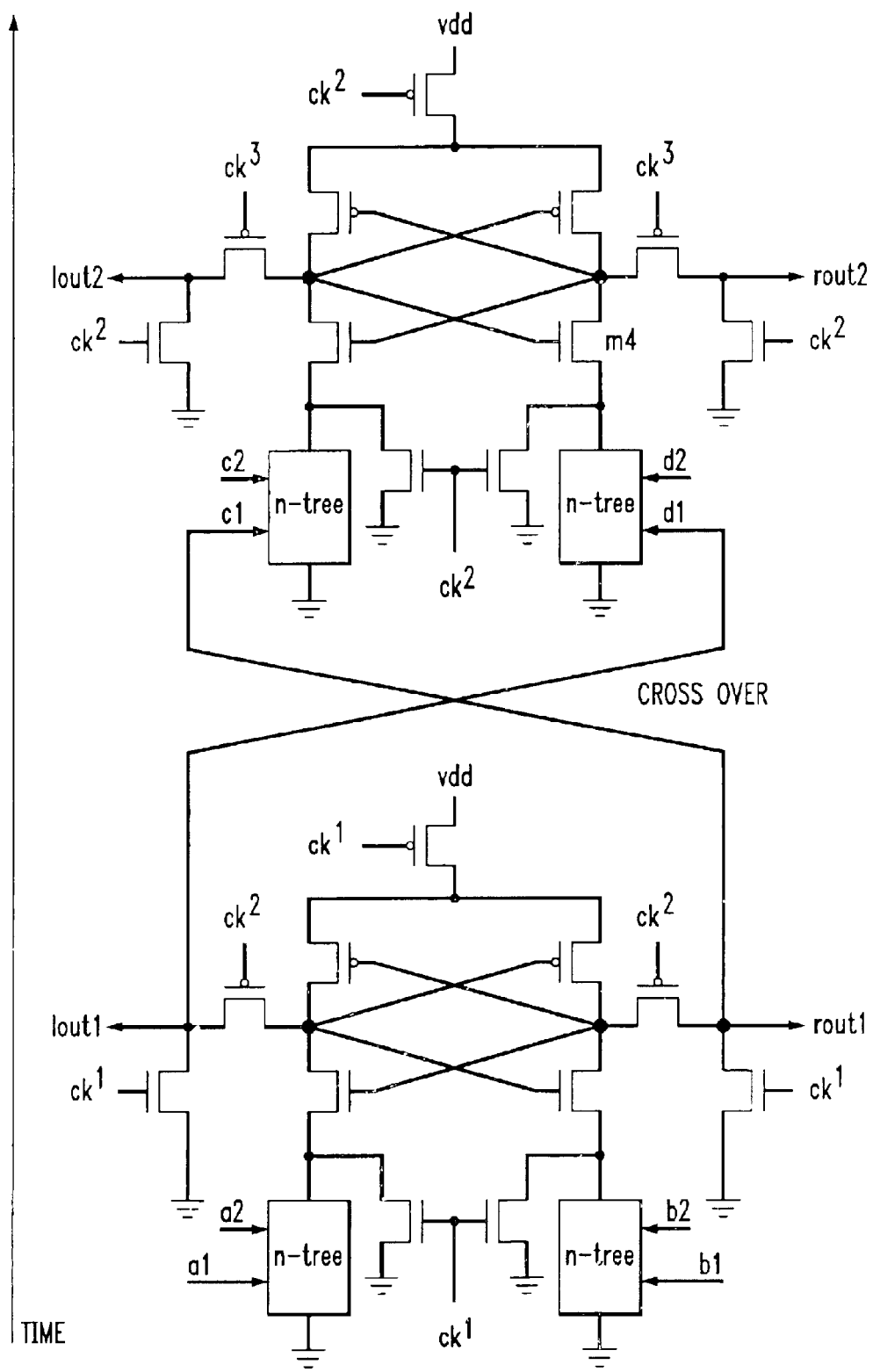
FIG. 17 shows a comparator having an N-tree to N-tree pipelined structure in accordance with the invention.
Figure 17:
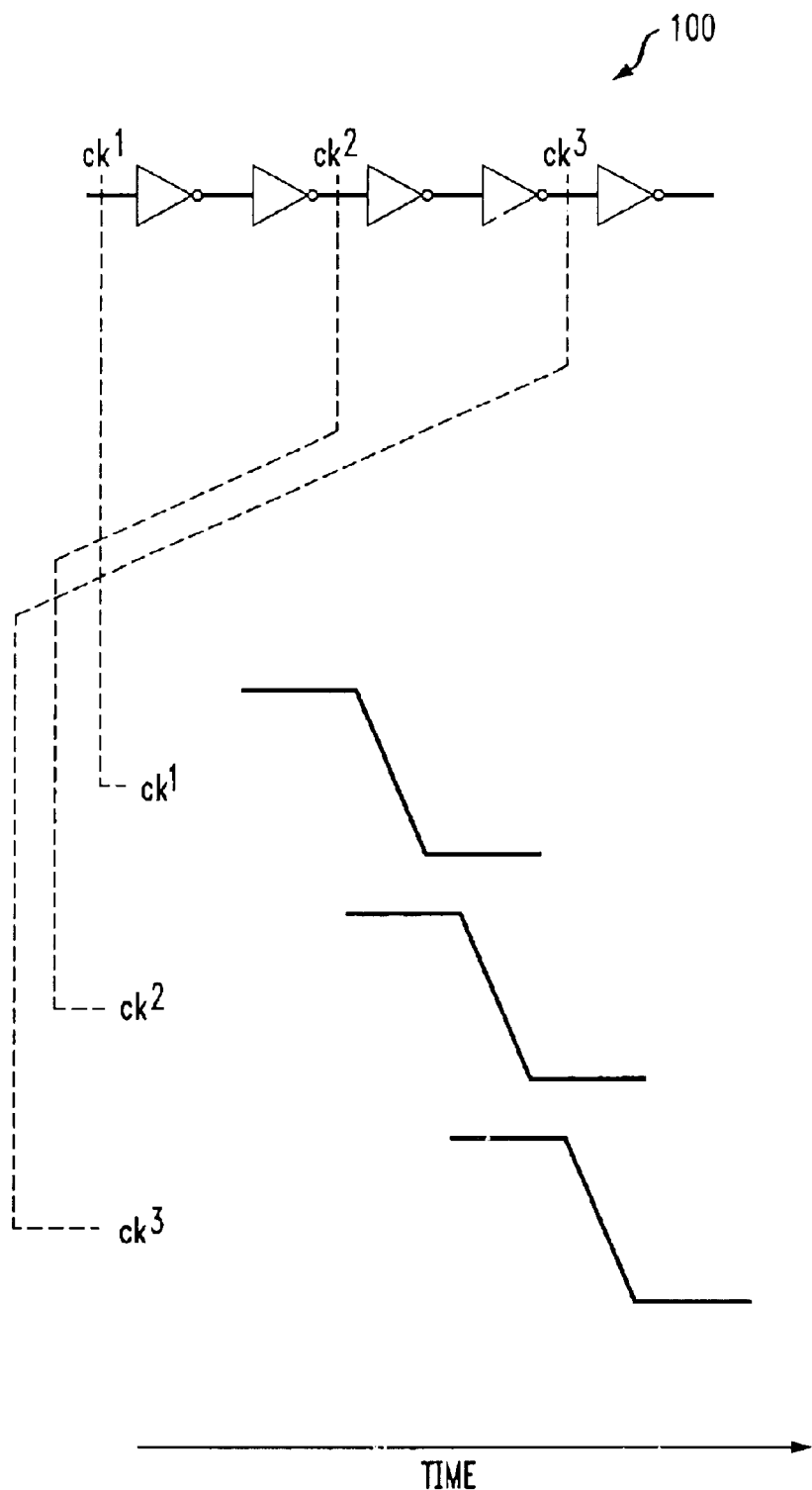

FIG. 17 shows an example of the N-tree to N-tree pipelined structure which is similar to that shown in FIG. 16. Note that the pipelined flow is from bottom to top in the figure. Clock signals $ck^1$, $ck^2$ and $ck^3$ are generated by tapping every second inverter of an inverter chain 100 as shown. Other techniques, such as a delay lock loop or a multi-phase oscillator can also be used to generate the needed clock signals. The clock signals $ck^1$, $ck^2$ and $ck^3$ are applied to transistors of the comparator as indicated in the figure. Two stages are shown in FIG. 17, each of which includes right and left evaluation legs with weighted arrays. Each of the evaluation legs are denoted as "N-tree," and these legs receive pairs of inputs a1, a2, b1, b2, c1, c2 and d1, d2 as shown. The outputs are denoted lout1, rout1, lout2 and rout2. The crossover may or may not be required depending on the desired final operation.

The term "clock delay" as used herein refers to a delay of a given clock signal, such as, e.g., the delay between clock signals $ck^1$ and $ck^2$ in FIG. 17 as measured from the midpoint of the falling edge of $ck^1$ to the midpoint of the falling edge of $ck^2$ as shown in the figure.

Figure 18:
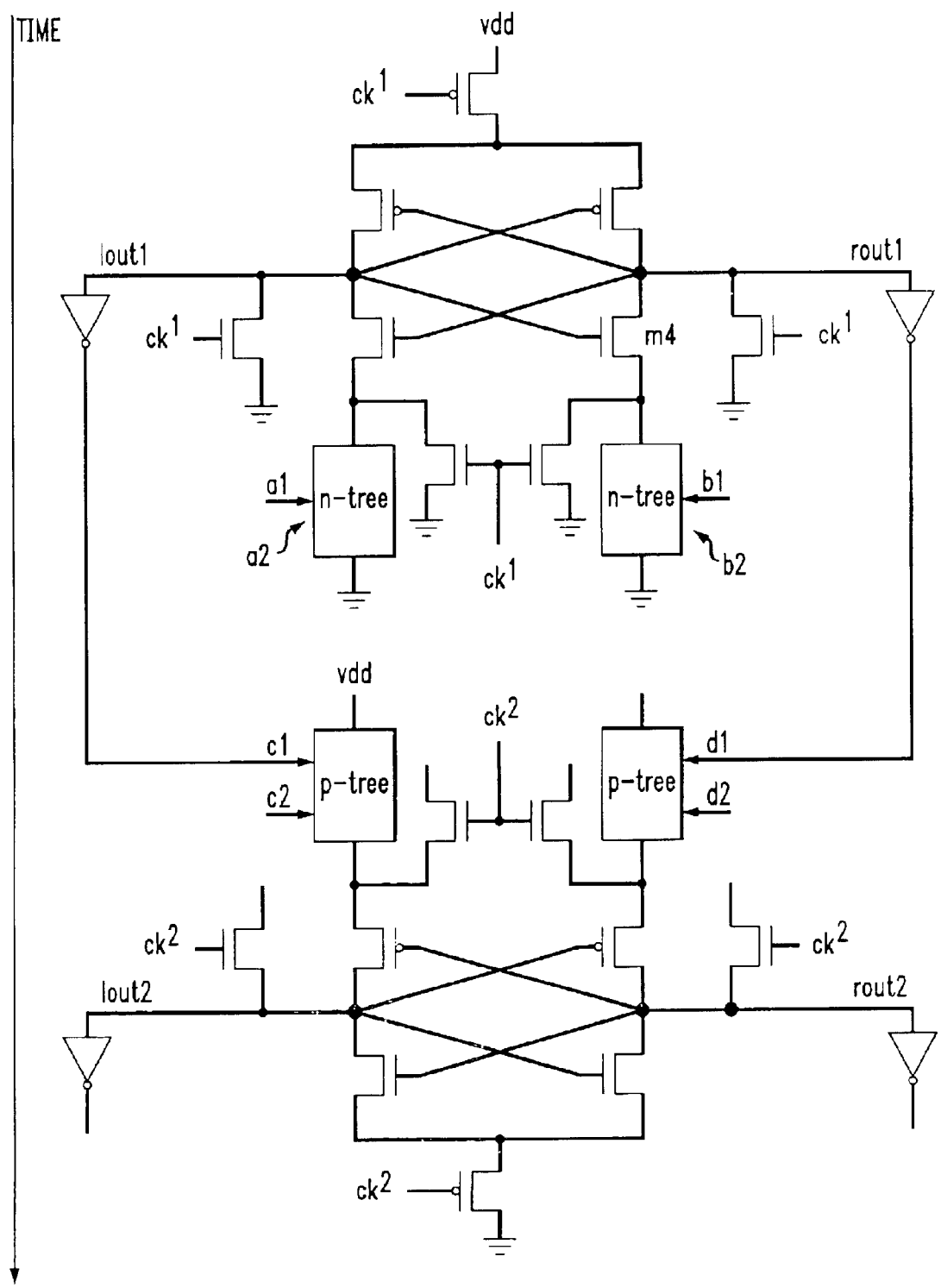
FIG. 18 shows a comparator having an N-tree to P-tree pipelined structure in accordance with the invention.
Figure 18:
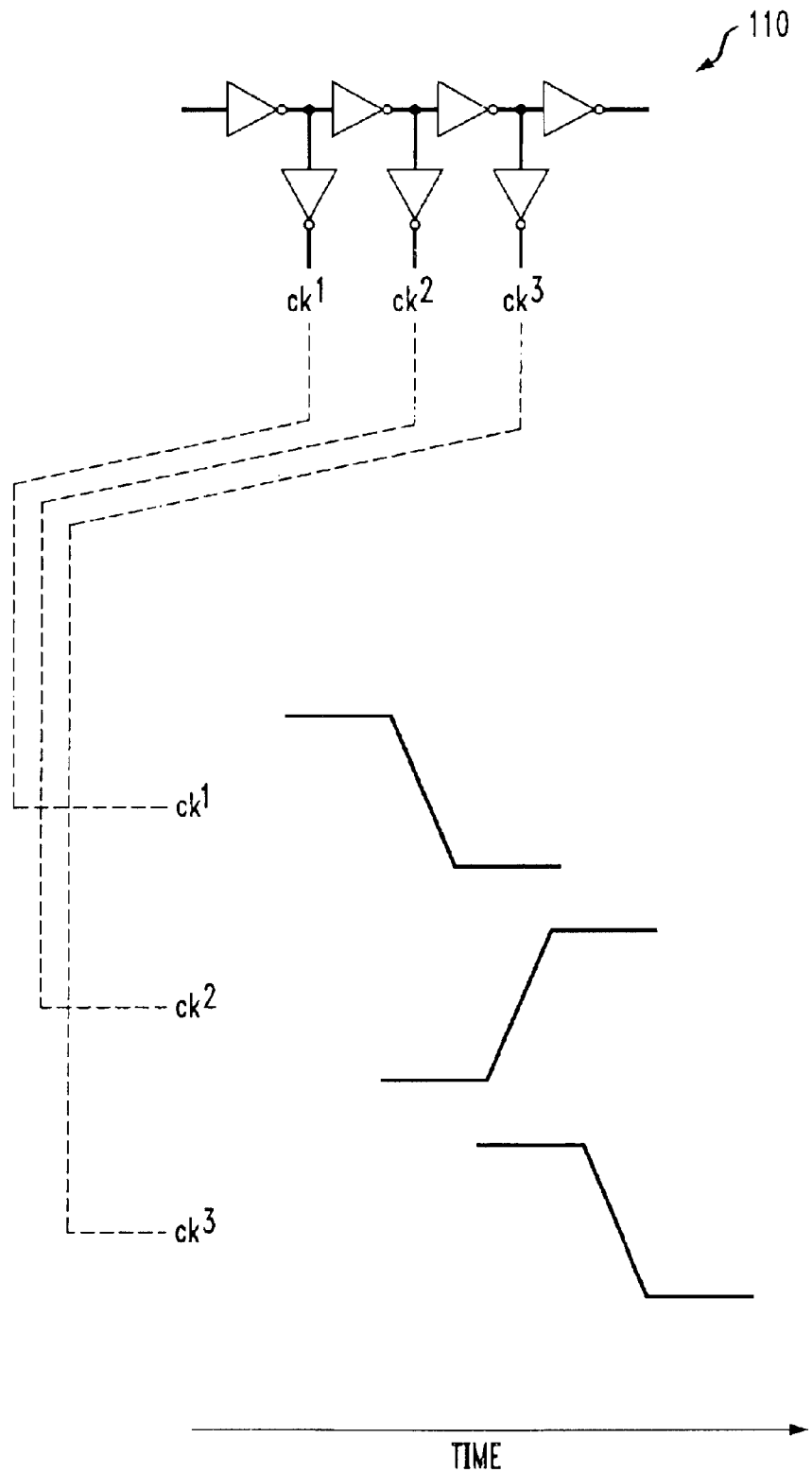

FIG. 18 shows an example of the N-tree to P-tree pipelined structure. Note that the pipelined flow is from top to bottom in the figure and an inverter is inserted between each of the outputs lout1 and rout1 of the first stage and the corresponding inputs of P-tree evaluation legs of the second stage. This inverter is required so that the polarity of the output of the first stage is preconditioned for the inputs for the second stage. This occurs because of the N-tree to P-tree structure. A suitable clock generator circuit is shown in the figure and comprises an inverter chain 110 tapped after each of the first three of the series inverters. In the FIG. 18 pipelined structure, the first stage evaluation legs receive pairs of inputs a1, a2 and b1, b2 as shown. The outputs lout1 and rout1 of the first stage are inverted and applied to the second stage P-tree structures as inputs c1 and d1, respectively. These P-tree structures also receive inputs c2 and d2 as shown. The second stage generates outputs lout2 and rout2.

As noted previously, the FIG. 16 pipelined comparator can be implemented using the circuit structures of FIG. 17 or FIG. 18, or other suitable pipelining structures that will be apparent to those skilled in the art.

Majority Rule Circuits

Figure 19:
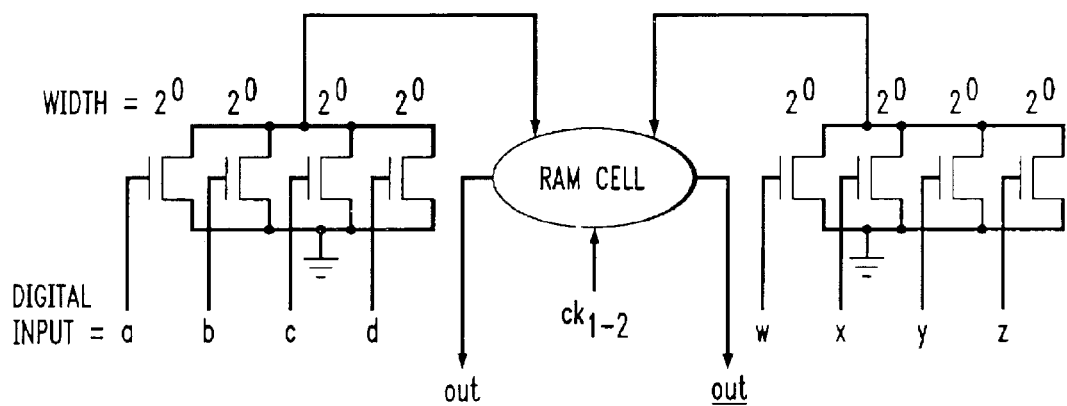
FIG. 19 shows a majority rule circuit in accordance with the invention.

FIG. 19 shows an example of a majority rule circuit configured using the basic comparator circuit of FIG. 11. A majority rule circuit of this type is useful for determining which of two n-bit digital inputs has a larger strength, i.e., which has a greater number of "1" values. In this example, the majority rule circuit is a 4-bit comparator. Each of the transistors of the weighted arrays in the left and right evaluation legs have substantially equal width. This is indicated by the $2^0$ weighting associated with each of the four transistors in the left and right arrays. The weighted array transistors of the left evaluation leg receive a digital input in the form of four bits a, b, c and d, while the weighted array transistors of the right evaluation leg receive a digital input in the form of four bits w, x, y and z. If the abcd input includes more "1" values than the wzyz input, the left leg resistance $R_1$ will be less than the right leg resistance $R_2$, and the comparator output signals out and out will be "1" and "0" respectively upon evaluation.

Although not shown in the figure, one or more offset transistors may be included in the FIG. 19 circuit or other majority rule circuit in accordance with the invention in order to produce a predictable output in the event of a "tie" as previously described.

Analog Common Mode Comparators

Figure 20:
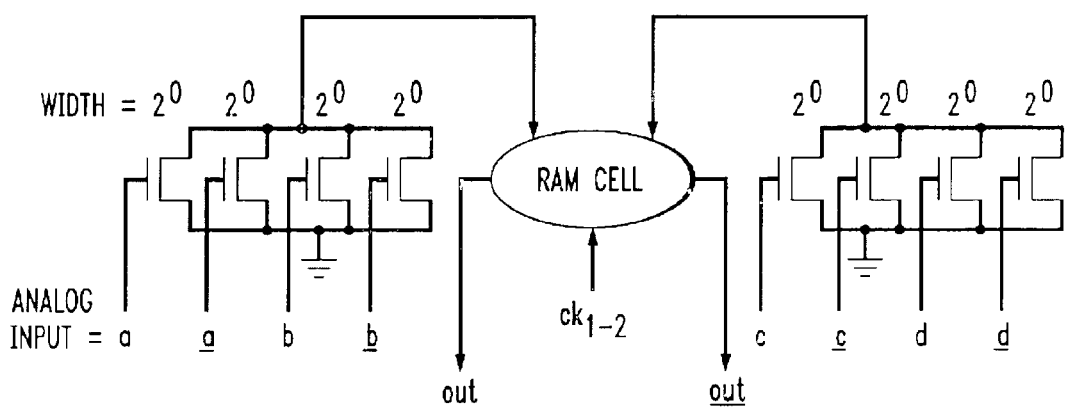
FIG. 20 shows an analog common mode comparator in accordance with the invention.

FIG. 20 shows an example of an analog common mode comparator configured using the basic comparator circuit of FIG. 11. The FIG. 20 circuit includes left and right evaluation legs having weighted arrays configured with equal weighting as in the FIG. 19 circuit. The left evaluation leg receives balanced analog input pairs a, a and b, b, and the right evaluation leg receives balanced analog input pairs c, c and d, d. The common mode comparator outputs out and out provide digital signals indicative of the difference between the common mode of analog input signals a and b relative to analog input signals c and d.

Greater Than/Less Than Circuits

Figure 21:
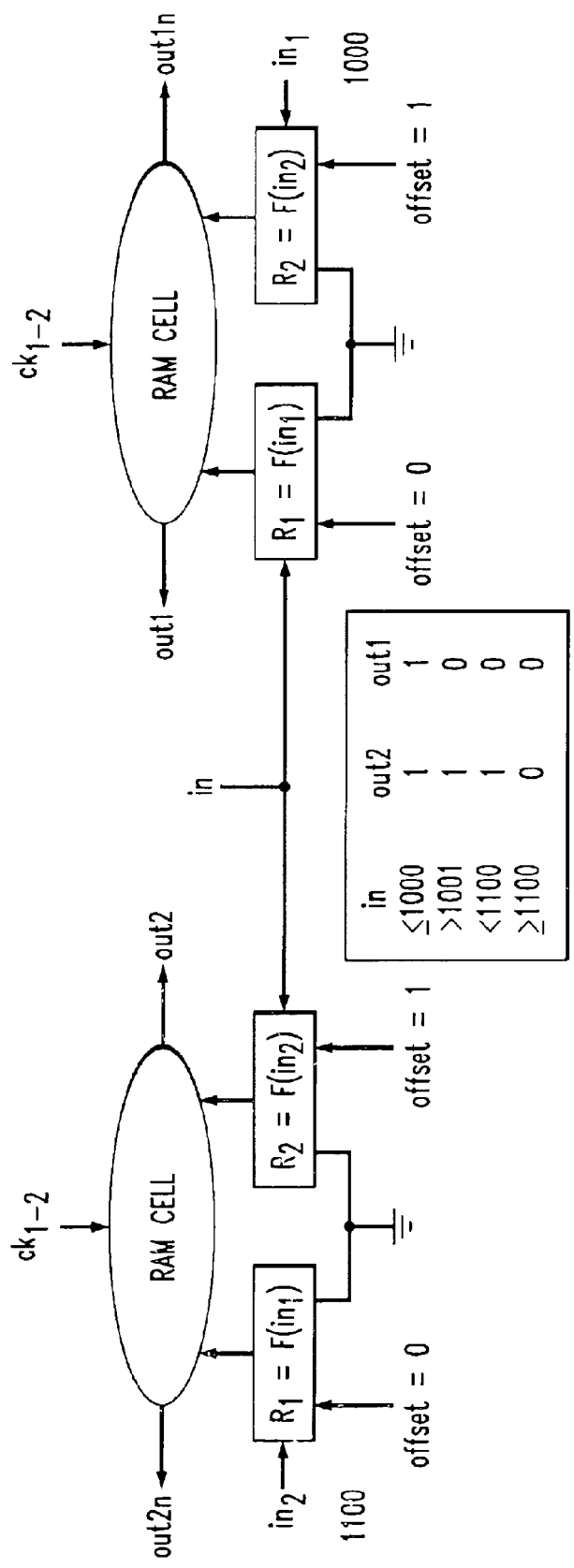
FIG. 21 shows a greater than/less than circuit in accordance with the invention.

FIG. 21 shows an example of a greater than/less than circuit configured using a combination of two of the basic comparator circuits of FIG. 11. Such a circuit is useful in applications in which it is desirable to place bounds on a comparison operation. More particularly, in a greater than/less than circuit, both an upper limit and a lower limit may be provided. The FIG. 21 circuit implements a comparison to determine if a particular 4-bit digital input signal in has a value between a 4-bit lower limit $in_1$ and a 4-bit upper limit $in_2$. The signal in is applied to the right leg of the first one of the FIG. 11 comparator circuits and to the left leg of the second one of the FIG. 11 comparator circuits. The lower limit $in_1$ has a value of 1000 binary in this example, and is applied to the right evaluation leg of the second comparator circuit. The upper limit $in_2$ has a value of 1100 binary in this example, and is applied to the left evaluation leg of the first comparator circuit.

The figure includes a table indicating the particular values of the out1 and out2 signals generated depending on the relationship of the input in to the lower and upper limits. It can be seen from the "≦1000" and "≧1100" entries of the table that the circuit is not configured to indicate equality with the limits, i.e., the limits are excluded. This is through the assignment of the offset values for the right evaluation legs of both comparators to "1" and for the left evaluation legs of both comparators to "0". The limits can be included by reversing the offset values.

Comparators for Three or More Inputs

The above-described example comparators are configured to compare two non-complementary signals simultaneously. Advantageously, the comparators allow a quick and efficient determination of the relative weights of the two input signals. The FIG. 11 comparator can also be used to implement a wide variety of non-complementary comparator circuits for processing more than two inputs simultaneously. Examples of such circuits will be described below in conjunction with FIGS. 22 through 34.

Array Addition and Comparison Circuits

Figure 22:
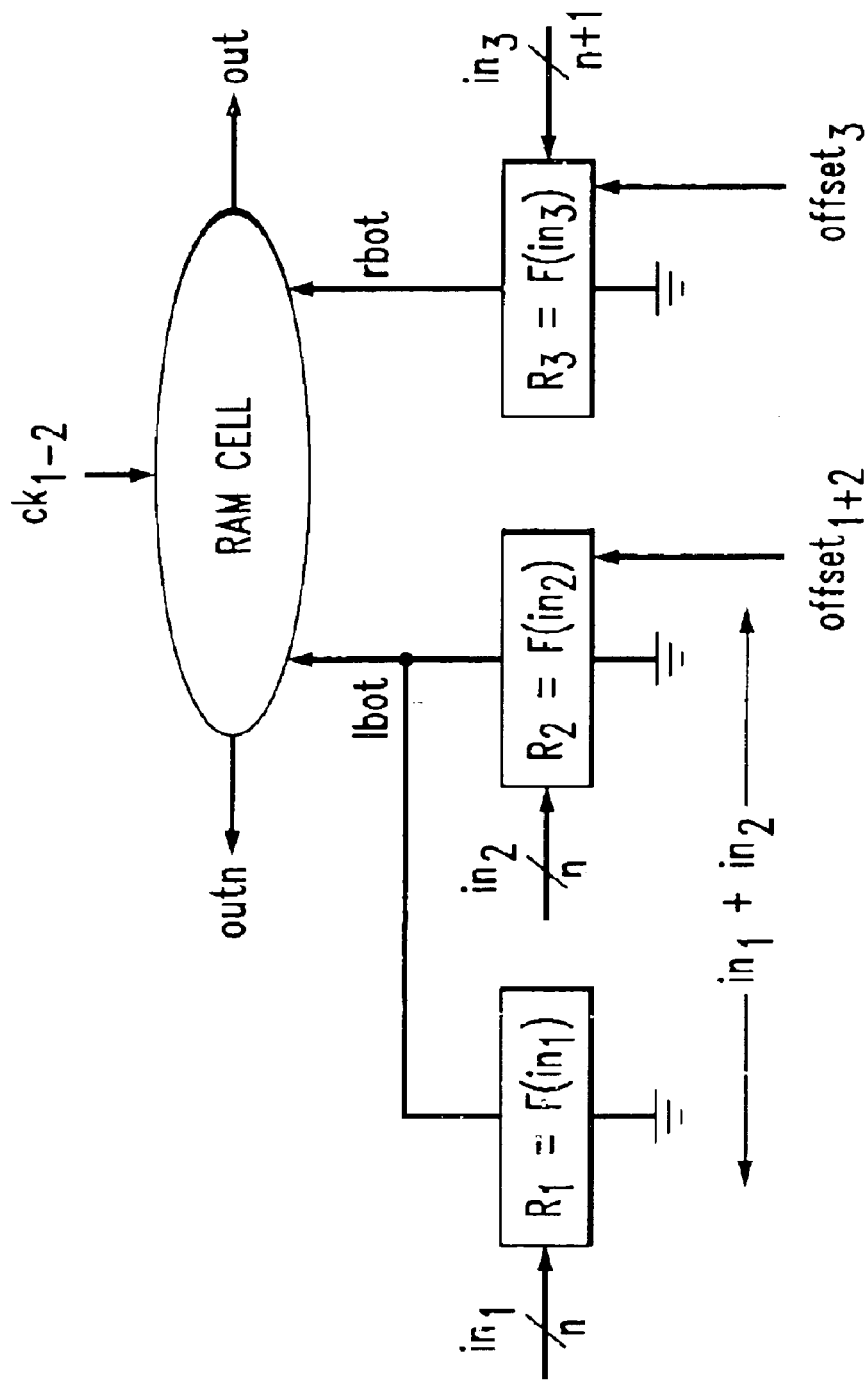
FIG. 22 shows an array addition and comparison circuit in accordance with the invention.

FIG. 22 shows an example array addition and comparison circuit configured using a variant of the basic comparator of FIG. 11. This circuit includes a pair of left evaluation legs corresponding to variable resistances $R_1$ and $R_2$, and a single right evaluation leg corresponding to a variable resistance $R_3$. The circuit performs an addition operation on two inputs and compares the result to a third input. More particularly, the combined influence of two n-bit inputs $in_1$ and $in_2$ each applied to one of the left evaluation legs is compared directly to the third input $in_3$ applied to the right evaluation leg.

The variable resistances $R_1$, $R_2$ and $R_3$ each may be implemented using a weighted array in the manner previously described, and are functions of their respective inputs $in_1$, $in_2$ and $in_3$. The inputs $in_1$ and $in_2$ are translated via the respective weighted arrays corresponding to $R_1$ and $R_2$ to analog components. These analog components are added together at node lbot and compared against an analog component generated at node rbot by translation of input $in_3$ via array $R_3$. The result of this comparison is given at nodes out and outn. The inputs and outputs of the FIG. 22 circuit are fully digital. The translation of the inputs $in_1$, $in_2$ and $in_3$ into analog components is a type of DTA conversion and the translation of the analog result back to digital form is a type of ATD conversion, both as previously described in conjunction with FIG. 11. Like the FIG. 11 circuit, the FIG. 22 circuit can perform its combined DTA and ATD operations in under 1 nsec for 9-bit digital inputs.

Figure 23:
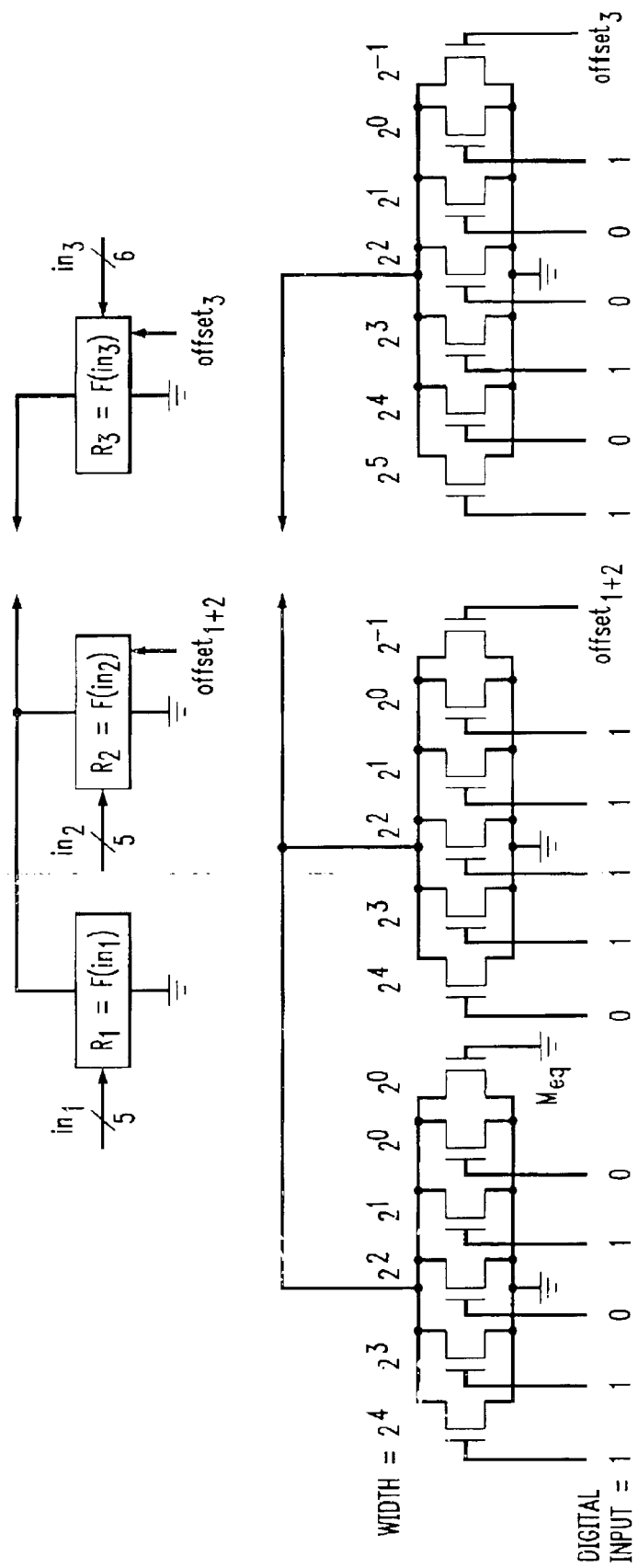
FIG. 23 illustrates the manner in which weighted arrays are utilized in an example implementation of the FIG. 22 comparator.

FIG. 23 shows a more particular example of the FIG. 22 circuit illustrating the weighted arrays for adding two 5-bit inputs $in_1$ and $in_2$ and comparing the result to a 6-bit input $in_3$. The weighted arrays are configured in the manner described previously, with each using five or six transistors having widths digitally weighted from $2^0$ to $2^4$ or $2^5$ and an additional transistor having a width denoted as $2^{-1}$. An additional transistor $M_{eq}$ of the weighted array in the first of the two left evaluation legs has its gate connected to ground as shown. An offset transistor of the weighted array in the second of the two left evaluation legs has applied to its gate an offset signal denoted as $offset_{1+2}$. An offset transistor of the weighted array in the right evaluation leg has applied to its gate an offset signal denoted as $offset_3$. One of the two offset transistors is enabled while the other is disabled so as to ensure a predictable output in the event of an equivalent result, in a manner similar to that previously described.

Assume that the two 5-bit inputs $in_1$ and $in_2$ are 11010 and 01111, respectively, while the 6-bit input $in_3$ is 101001, all as shown in the figure. By binary addition, the sum of the two 5-bit inputs is 101001, which is equal to the input $in_3$ applied to the weighted array associated with variable resistance $R_3$. The equivalence of the two sides is apparent by adding the total width of the enabled transistors on each side, assuming $2^0=1$ $\mu$m. In the weighted arrays associated with variable resistances $R_1$ and $R_2$, the total transistor widths are 26 $\mu$m and 15 $\mu$m, respectively, for a total of 41 $\mu$m between $R_1$ and $R_2$. In the weighted array associated with variable resistance $R_3$, the total width is 41 $\mu$m, which is equivalent to the combined total for $R_1$ and $R_2$.

The additional transistor $M_{eq}$ in the left-most weighted array ensures that the parasitic drain capacitance of both nodes lbot and rbot is substantially identical. In some cases, it is important to ensure that the corresponding evaluation legs appear equivalent to the RAM cell. Note that this additional transistor is shown as having its gate tied to ground in the FIG. 23 circuit but in other embodiments can be used to bring additional signal information, e.g., a carry input, into the circuit.

The circuits of FIGS. 22 and 23 can be readily extended to add more than two numbers on one side of the RAM cell and compare the result to an addition of two or more numbers on the other side of the cell.

Figure 24A:
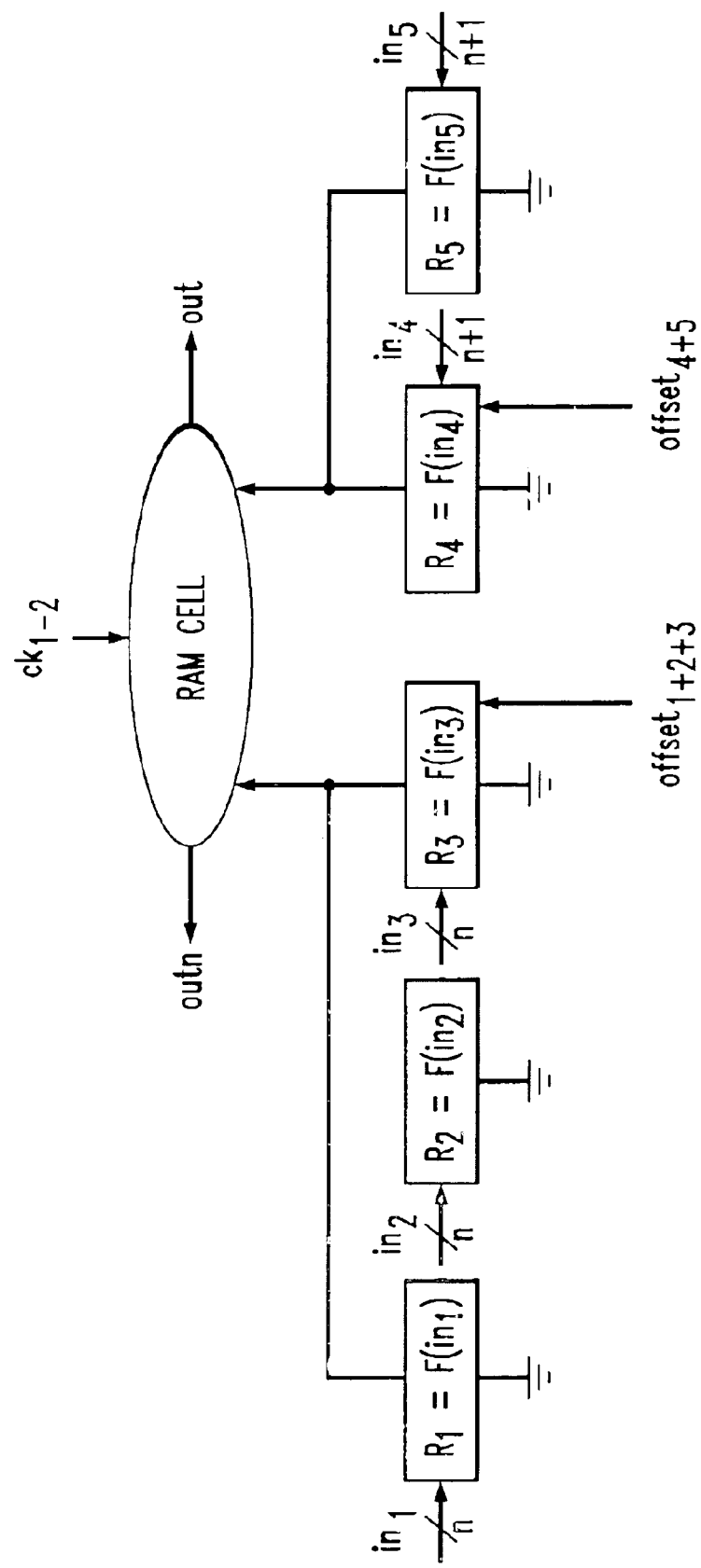
FIG. 24A shows another array addition and comparison circuit in accordance with the invention.

FIG. 24A shows an example of such a circuit in which three inputs $in_1$, $in_2$ and $in_3$ are applied to three left evaluation legs, with the result of the addition of these three inputs being compared to the result of an addition of two inputs $in_4$ and $in_5$ applied to two right evaluation legs. Associated with the evaluation legs are corresponding variable resistances $R_1$, $R_2$, $R_3$, $R_4$ and $R_5$, each of which may be implemented as a weighted array of transistors in the manner previously described. Offset signals $offset_{1+2+3}$ and $offset_{4+5}$ are applied to the innermost legs on each side of the RAM cell as shown.

Figure 24B:
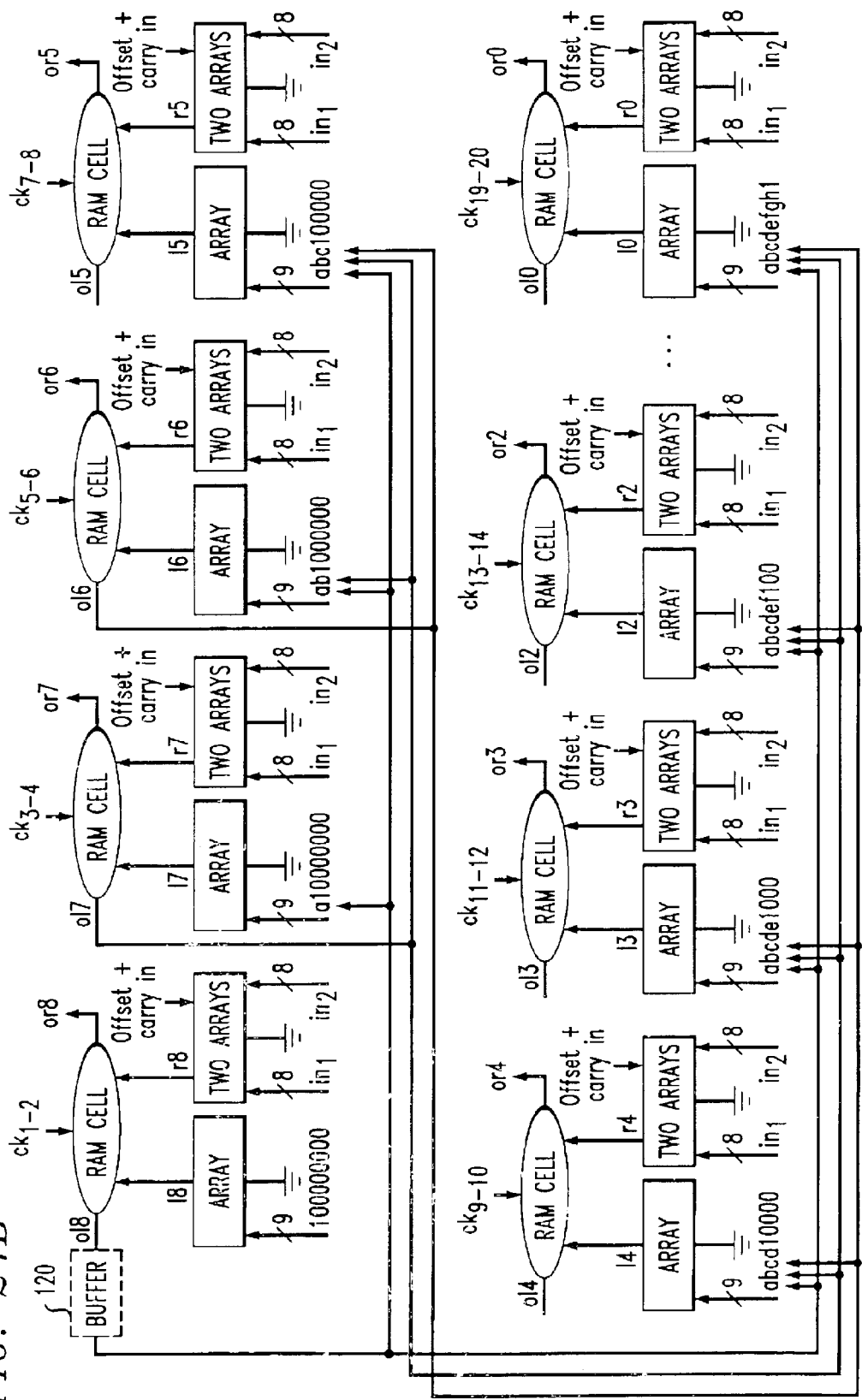
FIG. 24B shows an adder circuit implemented using an arrangement of array addition and comparison circuits.

FIG. 24B shows an adder circuit implemented using an arrangement of array addition and comparison circuits, each configured in a manner similar to that described in conjunction with FIG. 22. The FIG. 24B adder circuit includes nine array addition and comparison circuits arranged as shown, and operates to add two 8-bit inputs to generate a 9-bit result. Each of the nine array addition and comparison circuits includes a RAM cell, a left input leg having a single weighted array and a right input leg having two weighted arrays, and operates in a manner similar to that described in conjunction with FIG. 22. The left input leg arrays each receive a 9-bit input. The two arrays of each of the right input legs receive a pair of 8-bit inputs. More particularly, the two arrays of each right input leg each receive as an input one of two 8-bit signals $in_1$ and $in_2$ to be added. One of the arrays in each right input leg also receives an offset signal and a carry in signal.

The FIG. 24B adder circuit is implemented using an N-tree to N-tree pipelined structure similar to that previously described in conjunction with FIG. 17. In addition, this adder circuit utilizes a binary search method of a type to be described below in conjunction with FIG. 25, but includes additional cells rather than a finite state machine (FSM) as in the FIG. 25 circuit.

The binary search process in the FIG. 24B circuit begins in the array addition and comparison circuit that receives as its 9-bit left leg input the reference input 100000000. This is referred to as the first array addition and comparison circuit. The sum of $in_1$ and $in_2$ is then compared against this reference input. If the comparison indicates that the sum is smaller than the reference input, the output o18 is low. Note that a buffer 120 is placed on this output line. The buffer is used to drive the large fanout of the most significant bit for the remaining comparisons. Although not shown, similar buffers can also be placed at the o17 through o10 nodes.

Once the o18 output is determined, as denoted by "a" in the figure, that result is applied to the remaining array addition and comparison circuits in the most significant bit location as shown. The first array addition and comparison circuit uses clocks $ck_1$ and $ck_2$, the second array addition and comparison circuit uses clocks $ck_3$ and $ck_4$, and so on. Note than an additional delay has been incorporated into this pipelined structure, e.g., $ck_{1-2}$ and $ck_{3-4}$ are used for the respective first and second array addition and comparison circuits instead of $ck_{1-2}$ and $ck_{2-3}$, in order to account for the delay of the buffer 120. Each clock with a higher number designation k has its clock edge delayed by k−1 delay increments Δ relative to a corresponding clock edge of the $ck_1$. Thus during $ck_3$ and $ck_4$, the next comparison is evaluated in the second array addition and comparison circuit, this time comparing the sum of $in_1$ and $in_2$ to the 9-bit value a10000000, where "a" as noted above was determined in the first array addition and comparison circuit as output o18. The o17 output is determined from the second comparison, and is denoted by "b" in the figure. This result is applied to the remaining array addition and comparison circuits in the second most significant bit location as shown.

Similarly, the third array addition and comparison circuit compares the sum of $in_1$ and $in_2$ to the 9-bit value ab1000000. The result corresponding to output o16 is denoted by "c" in the figure and is placed in the next most significant bit location of the remaining 9-bit words. This process continues for each comparison to form results denoted "d," "e," . . . "h" until the last comparison is evaluated. The sum is given by the 9-bit word "abcdefgh and o10." As noted previously, this technique uses a type of N-tree to N-tree pipelined structure, with certain results from earlier stages being sent to multiple later stages in the manner described above.

Serial Adder-binary Search (SA-BS) Circuits

Figure 25:
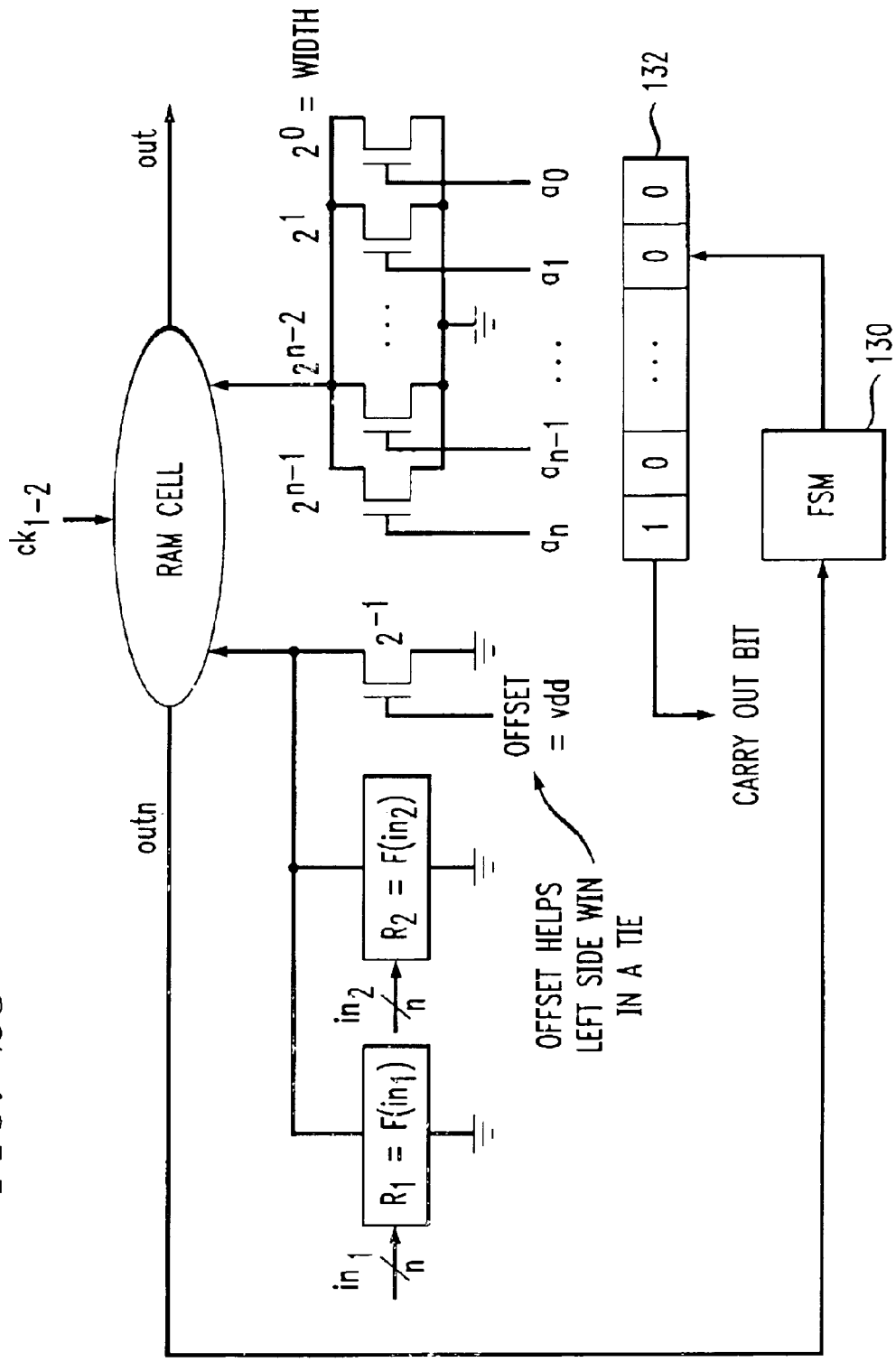
FIG. 25 shows a serial adder-binary search (SA-BS) circuit in accordance with the invention.

FIG. 25 shows an example serial adder-binary search (SA-BS) circuit configured using a variant of the basic comparator of FIG. 11. The circuit includes a RAM cell, two left evaluation legs and a right evaluation leg. The two left evaluation legs comprise variable resistances $R_1$ and $R_2$ which receive respective n-bit inputs $in_1$ and $in_2$. Each of the variable resistances $R_1$ and $R_2$ may be implemented as weighted arrays of n or more transistors in the manner previously described. The right evaluation leg comprises a variable resistance that is shown in the figure as being implemented as a weighted array of transistors. This weighted array receives as its input a known reference value $a_{n-0}=a_n$, $a_{n-1}$, . . . $a_0$ generated by a finite state machine (FSM) 130. The FIG. 25 circuit is configured to calculate the sum of the n-bit inputs $in_1$ and $in_2$.

The FSM 130 in this example initially generates reference value $a_{n-0}=100$ . . . 00 in a register 132 as shown so as to partition a binary search range in half. This is the first step in a binary search process. A comparison is then made between this reference value and the addition of the inputs $in_1$ and $in_2$ as implemented using the two weighted arrays on the left side of the circuit. The circuit output outn is a digital signal indicating the result of this comparison, and is fed back to an input of the FSM as shown in the figure. The FSM uses this signal to determine whether the upper range or lower range should be partitioned in half in the next step of the binary search process. If a decision is made to partition the upper range, the reference word for the next step of the process becomes 110 . . . 00. If a decision is made to partition the lower range, the reference word for the next step of the process becomes 010 . . . 00. The binary search process thus shifts the initial "1" in the MSB to the right by one bit position and replaces the MSB in the new reference value with a "1" if the result of the addition is larger than the initial reference word or with a "0" if the result of the addition is smaller than the initial reference word. The MSB also serves as a carry out bit. The binary search process continues until the result of the addition of the inputs $in_1$ and $in_2$ is indicated by the reference word and any carry out bit.

Figures 26, 27:
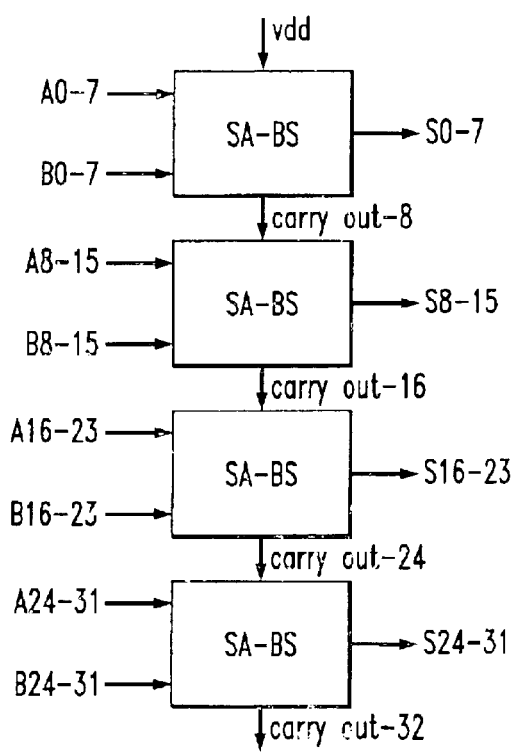
FIG. 26 shows example C-language code for the SA-BS operations of the FIG. 25 circuit.
FIG. 27 shows a 32-bit adder circuit in accordance with the invention.

FIG. 26 shows a set of example C-language programming code for performing the above-described serial addition-binary search operation. The time in clock cycles to complete an addition operation using the FIG. 25 circuit is n, i.e., the number of bits in each of inputs $in_1$ and $in_2$ and reference word $a_{n-0}$.

The FIG. 25 circuit includes on the left side thereof an additional transistor which receives as its input an offset signal. In this example, the offset is set to Vdd. Setting this offset in this manner ensures that the left side of the circuit will always "win" the comparison in the event that the result of the addition of inputs $in_1$ and $in_2$ is substantially equivalent to the reference value, i.e., in the event of a "tie."

An example of the operation of the FIG. 25 circuit in the event of the above-noted tie is as follows. Assume that the result of the addition of inputs $in_1$ and $in_2$ in the first step of the binary search is exactly 100 . . . 00, which also corresponds to the initial reference value. The previously-described offset ensures that the left side of the circuit will win this first comparison. The reference value then becomes 110 . . . 00, such that the right side of the circuit wins the next comparison. The reference value then becomes 101 . . . 00 and the right side of the circuit continues to win in all the remaining comparisons. In the last comparison, the reference value is 100 . . . 01. The right side thus wins, leaving the reference value at 100 . . . 00, which is equivalent to the addition of the two inputs as implemented using the two left side arrays.

FIG. 27 shows an example 32-bit serial adder-binary search (SA-BS) circuit formed by a series interconnection of four smaller 8-bit SA-BS circuits each receiving 8 bits of a first input signal A and 8 bits of a second input signal B. Each of the 8-bit SA-BS circuits in FIG. 27 may be configured substantially as shown in FIG. 25. In the upper-most 8-bit SA-BS circuit, the offset input is set to Vdd while its carry out bit carry out-8 is passed to the next SA-BS circuit in the series as its offset input. Similarly, the carry out-16 from the second SA-BS circuit is passed to the third SA-BS circuit as its offset input, and the carry out-24 from the third SA-BS circuit is passed to the fourth SA-BS circuit as its offset input. The carry out bit carry out-32 from the fourth SA-BS circuit is the carry out bit of the 32-bit adder.

Because carry out-8 takes one clock delay to evaluate, the second SA-BS circuit must wait an additional clock delay for this result. Similarly, the third and fourth SA-BS circuits must also each wait an additional clock delay for their respective carry out-16 and carry out-24 inputs. As a result, a 32-bit addition can be completed in a total of 11 clock delays. The carry out bit is the first bit determined, unlike in a conventional digital adder that typically computes the least significant additions before determining the carry out bit.

Analog Adder Circuits

Figure 28:
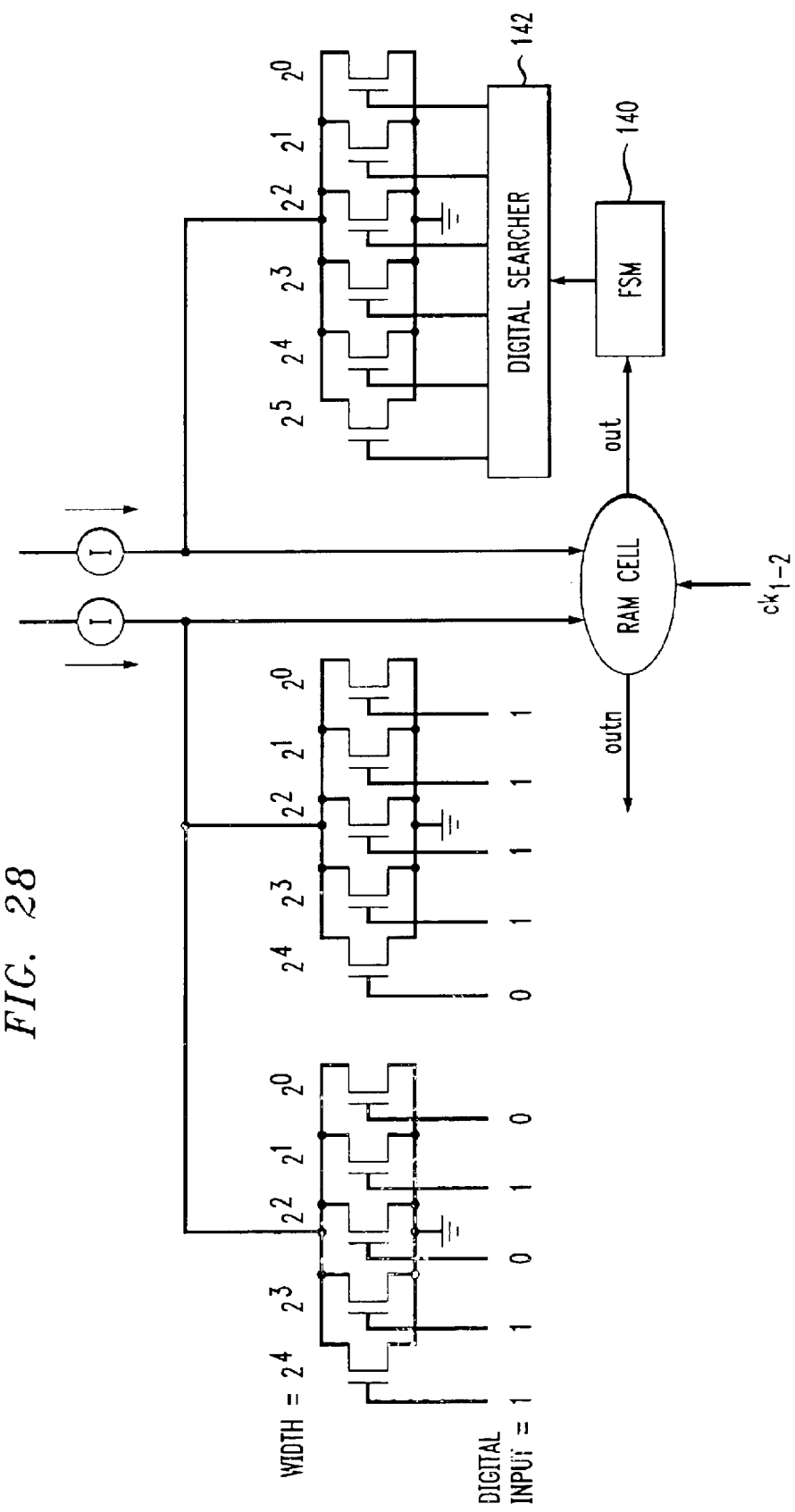
FIG. 28 shows an analog adder circuit in accordance with the invention.

FIG. 28 shows an analog version of the SA-BS circuit of FIG. 25. This analog adder circuit includes first and second 5-bit weighted arrays on a left evaluation side of the circuit, and a single 6-bit weighted array on a right evaluation side of the circuit. The arrays comprise n-channel transistors having widths sized in accordance with weightings $2^0$ through $2^4$ for the left side arrays and $2^0$ through $2^5$ for the right side arrays. Associated with each side of the circuit is a corresponding current source I providing a constant current. Offset and carry out devices are not shown but may be configured substantially as in the FIG. 25 circuit. The analog adder circuit compares the voltage drop across the combined first and second left side 5-bit arrays with that across the right side array for a given reference value generated under control of a finite state machine (FSM) 140 by a digital searcher 142. An input of the FSM is driven by an output out of the circuit. Decisions are made in a manner similar to that described in conjunction with the FIG. 25 circuit. However, in the analog adder circuit, since the constant current flows continually, the decision is made continuously except at updates to the reference value. In other embodiments, switched current sources may be used in order to save power.

Add-compare-select (ACS) Circuits

Figure 29:
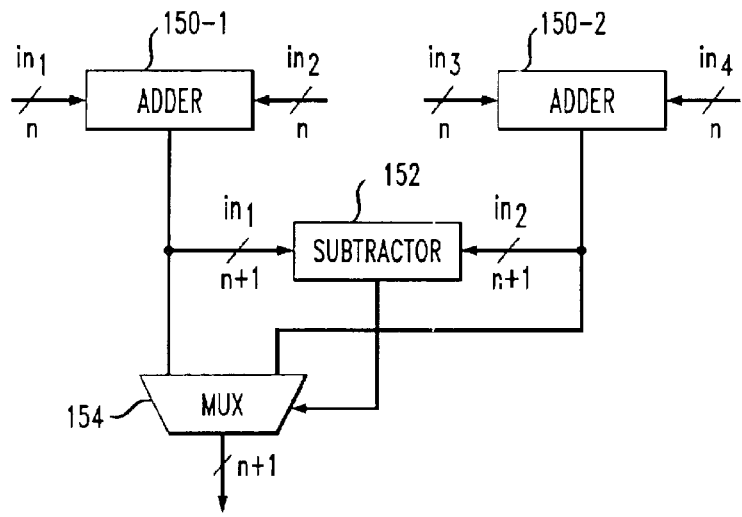
FIG. 29 shows a conventional add-compare-select (ACS) circuit.

FIG. 29 illustrates the structure of a conventional add-compare-select (ACS) circuit that may be more efficiently implemented using non-complementary comparators in accordance with the present invention. An ACS operation in the FIG. 29 example is performed on two different sets of inputs, and the sum of the largest set is passed to a subsequent processing block. Such operations are fundamental in communication signal processing applications such as Viterbi decoding, maximum likelihood decoding, etc. The FIG. 29 circuit includes first and second adders 150-1 and 150-2, a subtractor 152 and a multiplexer 154. Inputs $in_1$ and $in_2$ are added in the first adder 150-1 while inputs $in_3$ and $in_4$ are added in the second adder 150-2. The results of the two additions are compared by subtracting them in the subtractor 152, and the result of the subtraction is applied as a select input to the multiplexer 154 in order to select one of the addition results. This conventional approach is inefficient in terms circuit area and power dissipation.

Figure 30:
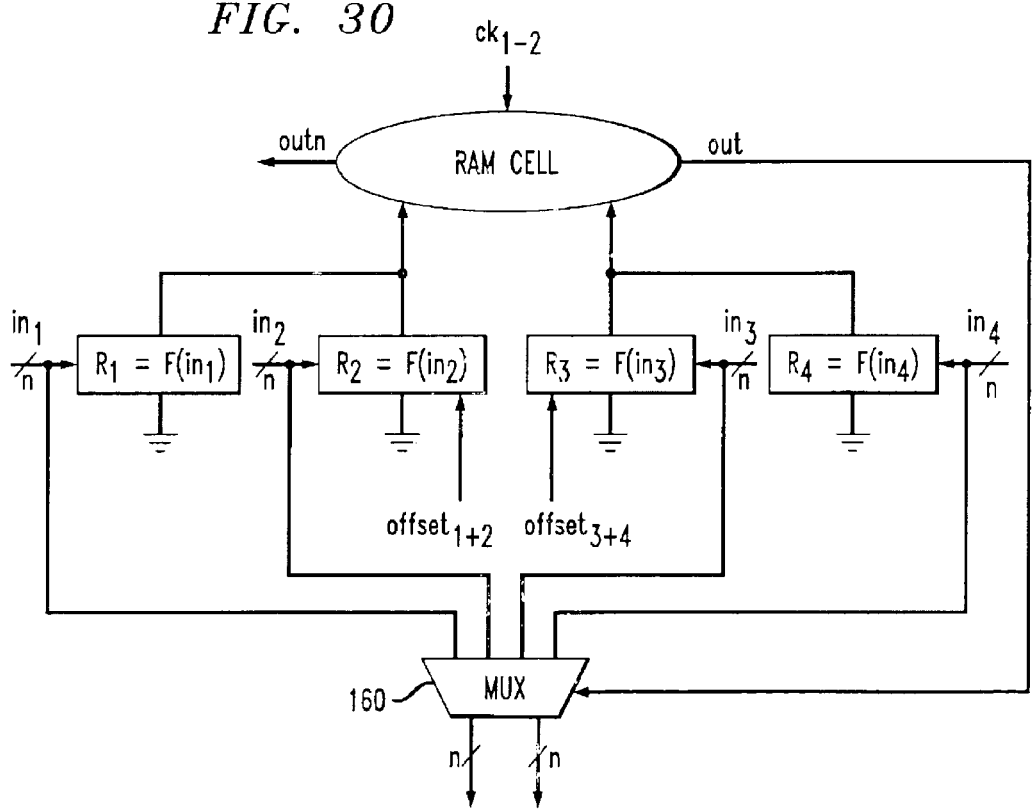
FIG. 30 shows an ACS circuit implemented using non-complementary comparators in accordance with the invention.

FIG. 30 shows an ACS circuit implemented using a variant of the basic non-complementary comparator of FIG. 11. This ACS circuit includes a RAM cell, left side and right side evaluation legs each having two parallel variable resistances, and a multiplexer 160. The left side of the circuit includes variable resistances $R_1$ and $R_2$ which receive n-bit inputs $in_1$ and $in_2$, respectively, and the right side of the circuit includes variable resistances $R_3$ and $R_4$ which receive n-bit inputs $in_3$ and $in_4$, respectively. The variable resistances may each be implemented using a weighted array in the manner previously described. The left side variable resistance $R_2$ receives as an offset input a signal $offset_{1+2}$ and the right side variable resistance $R_3$ receives as an offset input a signal $offset_{3+4}$. The inputs $in_1$, $in_2$, $in_3$ and $in_4$ are also applied as inputs to the multiplexer 160, and an output out of the circuit is applied as a select signal to the multiplexer 160.

In operation, both pairs of inputs $in_1$, $in_2$ and $in_3$, $in_4$ are simultaneously added together and the addition result for one pair is compared to the addition result for the other pair. The result of the comparison is the output signal out used to select a particular one of the pairs for passage to the output of the multiplexer. Note that the FIG. 30 circuit does not calculate the sum of the two inputs selected and passed through the multiplexer. The select signal is instead used to pass both $in_1$ and $in_2$ or $in_3$ and $in_4$. This is because in many applications it is appropriate to perform the addition only once at the end of a layered architecture comprising multiple ACS circuits of the type shown in FIG. 30, as will be described in greater detail in conjunction with FIG. 31.

Figure 31:
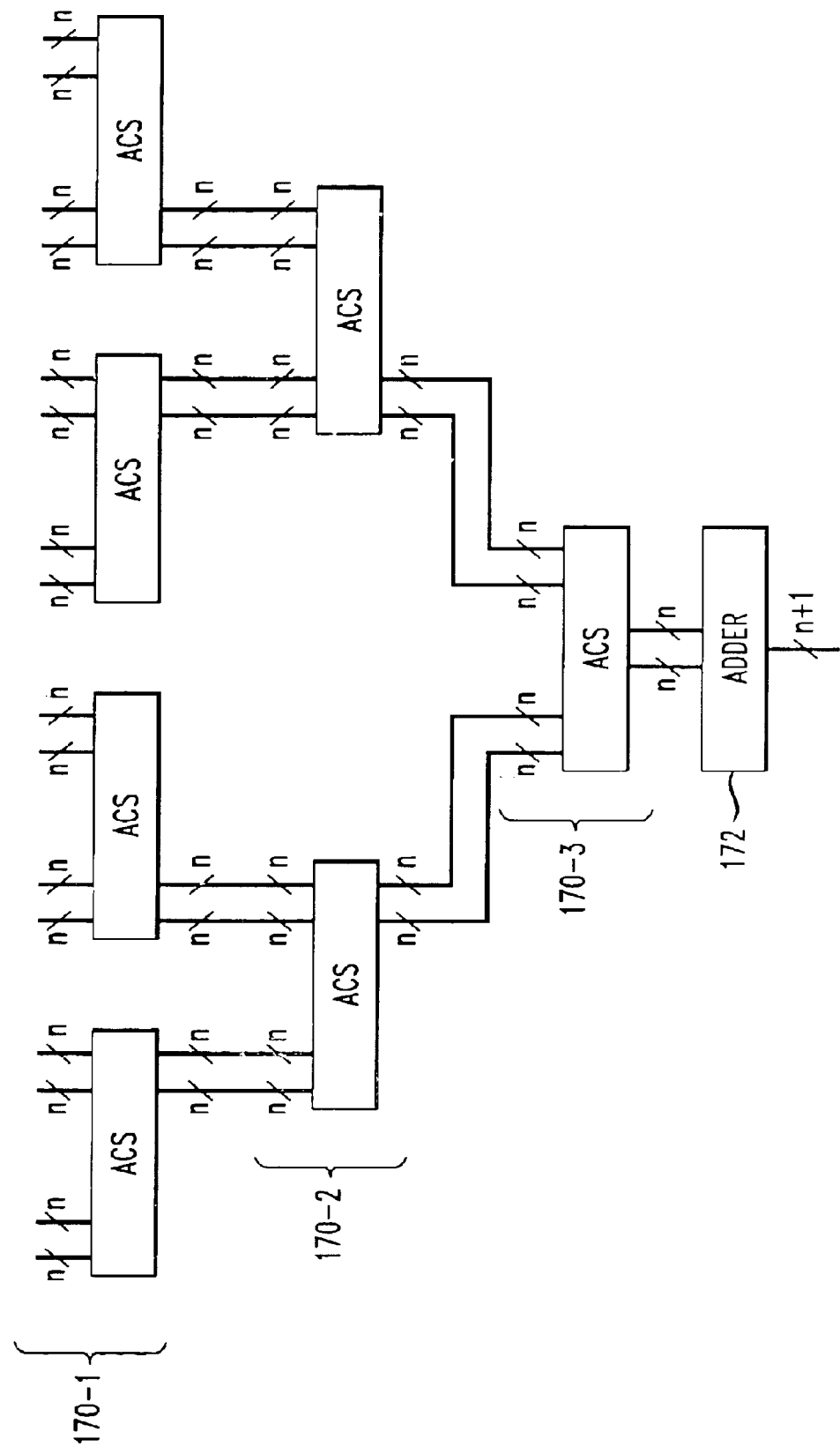
FIG. 31 shows an ACS architecture formed from ACS circuits of the type illustrated in FIG. 30.

FIG. 31 shows one example of the above-noted layered architecture, configured to compare eight different pairs of inputs. A first layer 170-1 comprises four ACS circuits, a second layer 170-2 comprises two ACS circuits, and a third layer 170-3 comprises a single ACS circuit. An adder 172 is included to calculate the sum of the two inputs in the particular pair of inputs selected by the single ACS circuit of the third layer 170-3. In this architecture, all eight pairs of inputs are compared without performing an actual addition operation. More particularly, the winning pairs from one layer are compared against one another at a subsequent layer until a final winning pair is identified, and an addition is then performed only for the inputs of the final winning pair. The non-complementary comparator on which the FIG. 30 circuit is based allows for this particularly efficient ACS architecture.

Figures 32, 33:
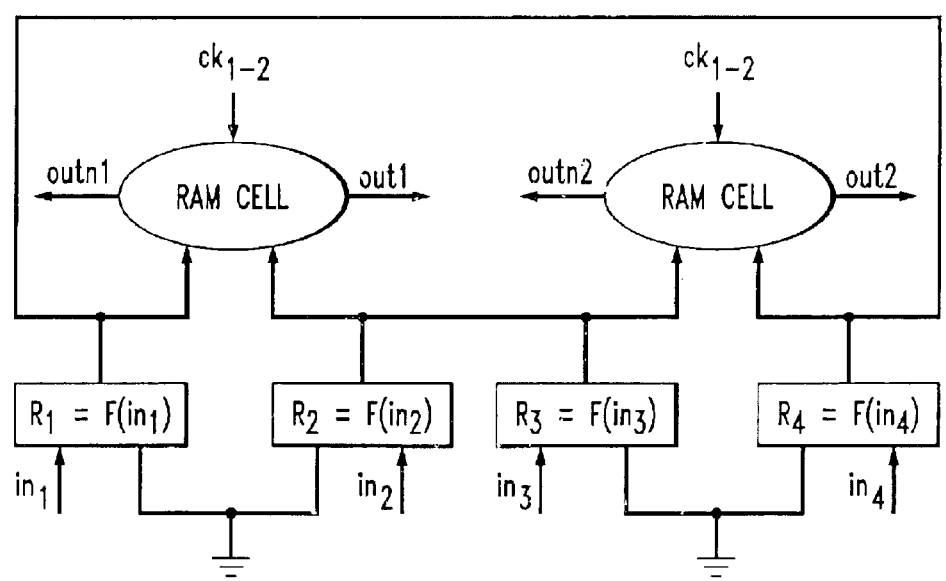
FIG. 32 is a tabulation of simulation results illustrating the advantages of the ACS circuit of FIG. 30 relative to the conventional ACS circuit of FIG. 29.
FIGS. 33 and 34 show coupled memory cell comparators in accordance with the invention.

FIG. 32 shows a tabular listing of simulation results illustrating performance improvements attributable to the present invention for an example ACS circuit. The power requirements in microwatts ($\mu W$), transistor count, and delay in picoseconds are compared for the conventional FIG. 29 ACS circuit and the FIG. 30 ACS circuit of the present invention (denoted "seesaw" in the figure).

The simulations were carried out using 0.16 $\mu m$ CMOS technology with a power supply Vdd of 1.5V and a frequency of operation of 200 MHz. The delay was measured at an ambient temperature of 105° C. while the power was measured at 0° C. and high Vdd. The conventional ACS circuit of FIG. 29 was assumed to use a ripple-carry design for the adder and subtractor elements. As is apparent from the table of FIG. 32, the FIG. 30 ACS circuit resulted in a substantial savings in terms of power (×20 gain factor), transistor count (×95 gain factor) and delay (×2.17 gain factor) required for add and compare operations relative to the conventional FIG. 29 ACS circuit, at the cost of minor increases in the power and transistor count for the select operations. The latter increases are attributable primarily to the fact that the multiplexer circuit in the FIG. 30 ACS circuit passes two n-bit buses instead of one n+1 bus.

Coupled Memory Cell Comparators

Figure 34:
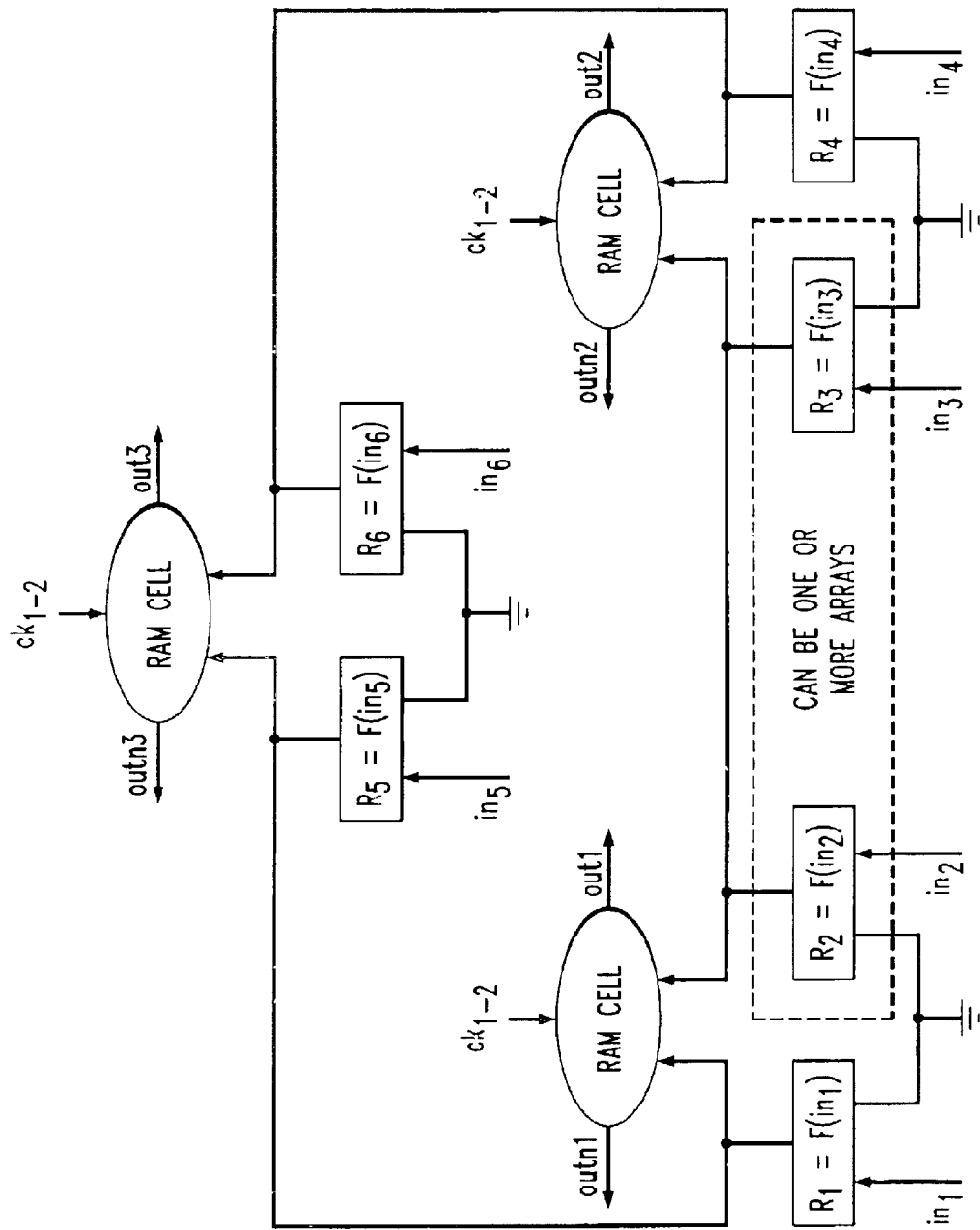

FIGS. 33 and 34 show examples of coupled memory cell comparators in accordance with the invention. These comparators are formed using different combinations of the basic comparator of FIG. 11.

The FIG. 33 circuit includes a pair of the FIG. 11 comparators connected in parallel as shown. This circuit as configured compares the sum of inputs $in_2$ and $in_3$ with the sum of inputs $in_1$ and $in_4$. The top wire in FIG. 33 can be opened, in which case the circuit will compare $in_1$ against $in_2+in_3$ and make a second comparison of $in_2+in_3$ against $in_4$.

The FIG. 34 circuit is configured like the FIG. 33 circuit but includes a third FIG. 11 comparator coupled to the first and second FIG. 11 comparators as shown. The input legs denoted $R_2$ and $R_3$ in this embodiment may each comprise multiple weighted arrays of the type previously described herein. The FIG. 34 circuit compares the sum of inputs $in_2$ and $in_3$ with the sum of inputs $in_1$ and $in_5$ and the sum of inputs $in_4$ and $in_6$.

Those skilled in the art will recognize that other coupled memory cell comparators can be generated using multiple interconnected comparators of the type described in conjunction with FIG. 11. For example, multi-input comparator techniques such as those described in the above-cited U.S. Pat. No. 6,191,623 and U.S. patent application Ser. No. 09/162,852 may be used in conjunction with the comparators described herein to form a wide variety of different comparators having three or more inputs.

Comparators with Mask Functions

Figure 35:
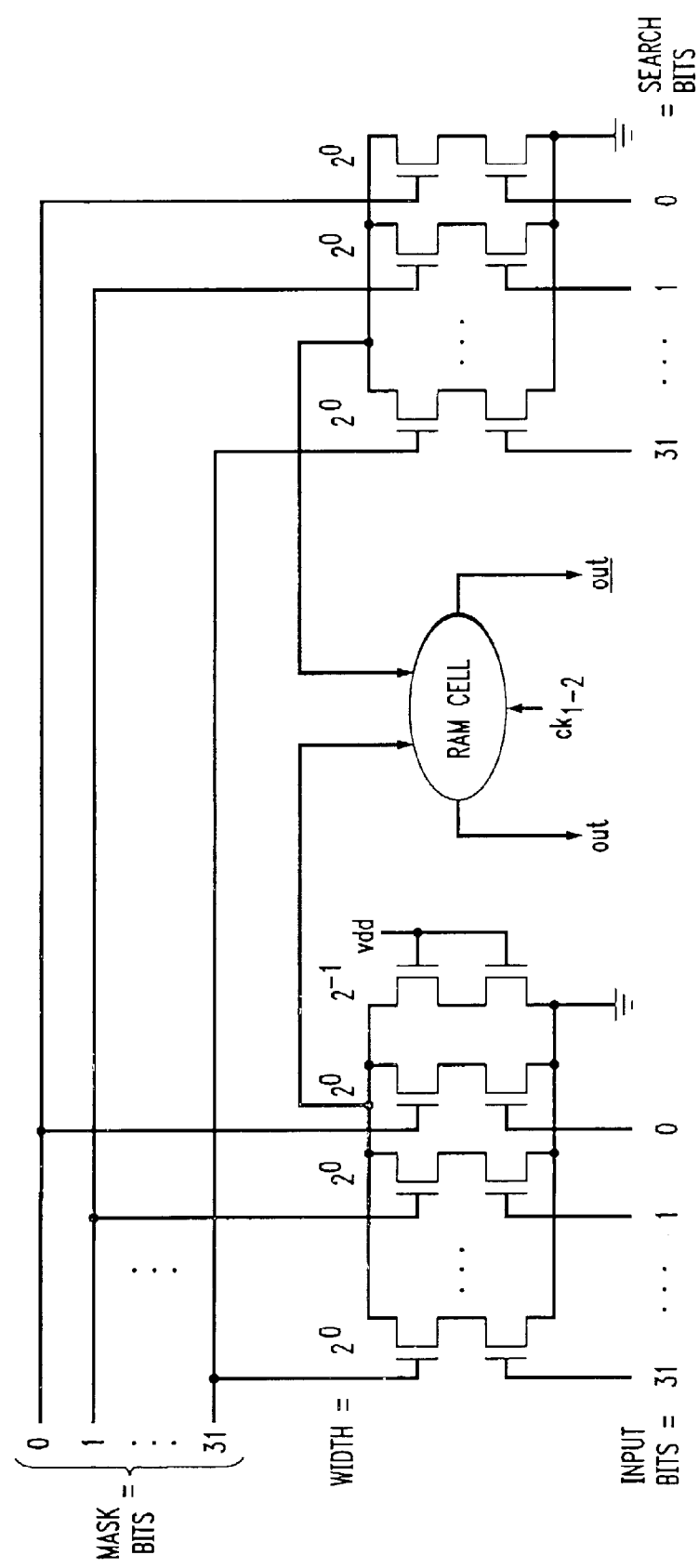
FIG. 35 shows a comparator circuit with a mask function in accordance with the invention.

FIG. 35 shows an example comparator circuit with mask function, configured using a variant of the basic comparator of FIG. 11. In this circuit, mask bits are applied to weighted arrays associated with left and right input legs. Each of the weighted arrays receives 32 mask bits and 32 input bits in this example. More particularly, the left side weighted array receives an input signal in the form of input bits 0, 1, ... 31 and the right side weighted arrays receives an input signal in the form of search bits 0, 1, ... 31, as shown. The mask bits are applied to the gates of upper transistors in the weighted arrays, while the input and search bits are applied to lower transistors in the respective left and right arrays. The transistors of the left and right arrays are digitally weighted with a constant $2^0$ weighting, with the exception of offset transistors in the left array which have a $2^{-1}$ weighting as shown. The offset transistors in the left array have their gates tied to Vdd as shown in the figure.

In operation, the FIG. 35 circuit implements a comparison of the input bits with the search bits, with particular bits being masked, i.e., excluded from the comparison, in accordance with the applied mask bits.

Alternative Comparator Configurations

Figure 36:
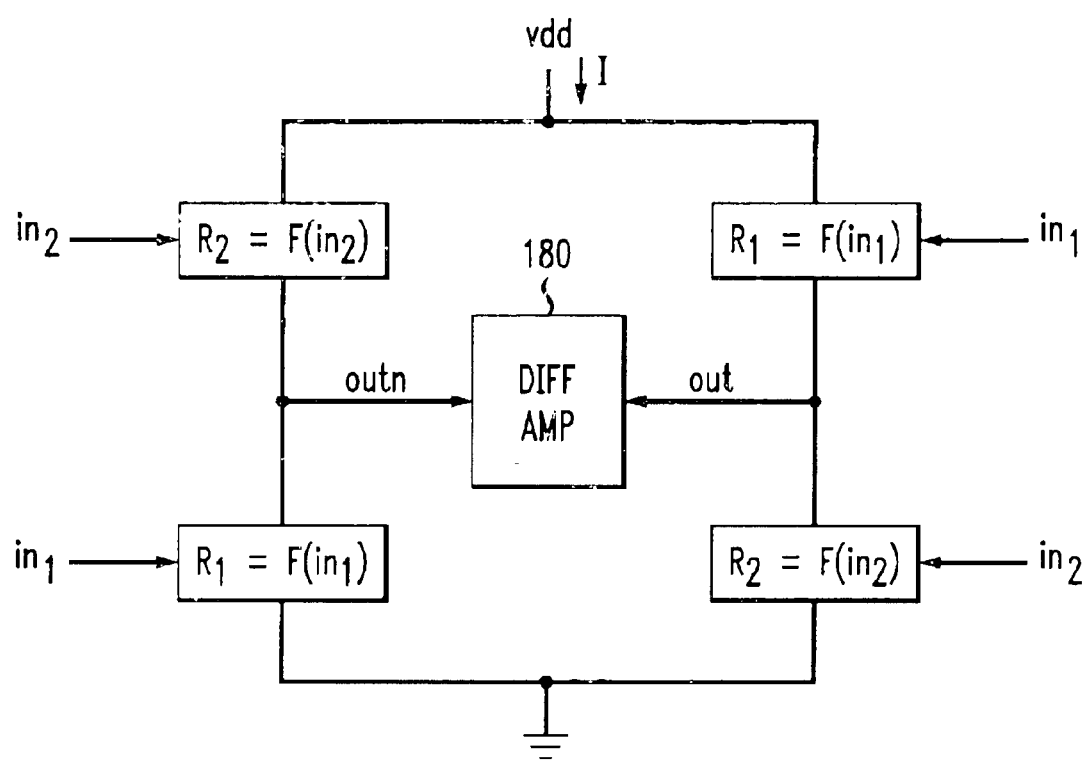
FIG. 36 shows a stacked implementation of a non-complementary comparator in accordance with the invention.

FIG. 36 shows another example comparator circuit in accordance with the present invention. This circuit is a non-clocked "stacked" configuration in which a constant current I is supplied to left and right evaluation legs each having variable resistances $R_1$ and $R_2$ arranged as shown. Inputs $in_1$ and $in_2$ are applied to the variable resistances $R_1$ and $R_2$, respectively, in both of the left and right legs. The resulting output signals out and outn are then applied to a differential amplifier 180 as shown. The variable resistances may be implemented using weighted arrays as previously described. It is assumed for this example circuit that the arrays for the upper resistances in each leg are formed using n-channel transistors. If the arrays for the upper resistances in each leg are instead formed using p-channel transistors, the inputs should be inverted.

The particular embodiments of the invention as described herein are intended to be illustrative only. For example, as previously noted, different device types and transistor technologies may be used in other embodiments. In addition, the basic comparator described herein may be implemented in other configurations, and can be used in higher level circuit applications other than those specifically described herein. Another possible alternative configuration is a circuit in which the evaluation element is in the form of a sample circuit that samples the variable parameters associated with the input legs such that the samples can be subsequently processed to extract information therefrom regarding the relationship of the applied inputs.

Also, the comparator circuits of the present invention may be implemented in the form of an integrated circuit which may or may not include additional circuit components or other processing or memory elements. Furthermore, as described in more detail above, the invention can operate with variable parameters other than the variable resistances described in conjunction with the illustrative embodiments, such as a variable current or variable voltage. Moreover, the invention can be applied to complementary input signals as well as non-complementary input signals. These and numerous other alternative embodiments within the scope of the following claims will be readily apparent to those skilled in the art.

What is claimed is:

1. A comparator circuit comprising:
an evaluation element; and
at least first and second input legs each coupled to a corresponding one of a first and second node of the evaluation element, the first and second input legs having non-complementary structures relative to one another and being adapted to receive respective first and second input signals, each of the non-complementary structures having associated therewith a variable parameter having a value that is a function of a corresponding one of the input signals, the evaluation element being adapted to perform a comparison of the first and second input signals.

2. The comparator circuit of claim 1 wherein the first and second input signals comprise non-complementary input signals.

3. The circuit of claim 1 wherein the variable parameter for a given one of the input legs comprises a variable resistance.

4. The comparator circuit of claim 1 wherein the variable parameter for a given one of the input legs comprises a variable current.

5. The comparator circuit of claim 1 wherein the variable parameter for a given one of the input legs comprises a variable voltage.

6. The comparator circuit of claim 1 wherein the evaluation element comprises a memory cell.

7. The comparator circuit of claim 6 wherein the evaluation element comprises a random access memory (RAM) cell.

8. The comparator circuit of claim 1 wherein the evaluation element comprises a differential amplifier.

9. The comparator circuit of claim 1 wherein at least one of the first and second input legs comprises a weighted array of transistors, each of the transistors in the weighted array adapted to receive a particular portion of an input signal applied to that leg.

10. The comparator circuit of claim 9 wherein the weighted array comprises an array of transistors digitally sized in width in accordance with a corresponding relationship between portions of a digital input signal.

11. The comparator circuit of claim 9 wherein the weighted array comprises an additional transistor having an input adapted to receive an offset signal, the offset signal being configured so as to ensure a predictable output result if comparison of the first and second inputs would otherwise result in an unpredictable output.

12. The comparator circuit of claim 1 wherein each of the first and second input legs comprises a weighted array of transistors, and wherein the first and second inputs each comprise a digital word having a plurality of bits, and wherein each transistor of the associated weighted array of transistors is adapted to receive as an input a corresponding bit of a given one of the digital words.

13. The comparator circuit of claim 12 wherein the transistors of the weighted array are weighted in accordance with factors $2^0, 2^1, \ldots 2^{n-1}$ in width and the weighted array is adapted to receive a corresponding input signal comprising an n-bit digital word.

14. The comparator circuit of claim 1 being implemented in a pipelined structure, the first and second input legs each being adapted to receive multi-bit digital words as the respective first and second input signals, the pipelined structure having a plurality of stages with each stage involving a comparison of designated portions of the multi-bit digital words.

15. The comparator circuit of claim 14 wherein the first and second input legs are adapted to receive m×n-bit digital words, and the pipelined structure has m stages with each stage configured to perform an n-bit comparison of a selected portion of the digital words.

16. The comparator circuit of claim 14 wherein the pipelined structure comprises an N-tree to N-tree structure.

17. The comparator circuit of claim 14 wherein the pipelined structure comprises an N-tree to P-tree structure.

18. The comparator circuit of claim 1 wherein each of the first and second input legs comprises a weighted array of transistors, the first and second input signals each comprising a digital word having a plurality of bits, wherein each transistor of a given one of the weighted arrays is adapted to receive as an input a corresponding bit of a given one of the digital words, each of the transistors in each of the weighted arrays having a substantially equal width such that comparison of the digital words implements a majority rule function.

19. The comparator circuit of claim 1 wherein each of the first and second input legs comprises a weighted array of transistors, the first and second input signals each comprising one or more balanced analog input signal pairs, inputs of parallel transistors in a particular one of the weighted arrays being adapted to receive respective signals of a given one of the pairs, each of the transistors in each of the weighted arrays having a substantially equal width such that the comparator circuit is configured to provide an analog common mode comparison.

20. The comparator circuit of claim 1 wherein each of the first and second input legs comprises a weighted array of transistors, the first and second input signals each comprising one or more analog input signals, inputs of parallel transistors in a particular one of the weighted arrays being adapted to receive corresponding ones of the analog input signals, each of the transistors in each of the weighted arrays having a substantially equal width such that the comparator circuit is configured to provide an analog common mode comparison.

21. The comparator circuit of claim 1 being a first comparator circuit coupled with a second comparator circuit having an evaluation element and at least first and second input legs each coupled to a corresponding one of a first node and a second node of the evaluation element of the second comparator circuit, the first input leg of the first comparator being adapted to receive an input signal representing a first bound, the second input leg of the second comparator being adapted to receive an input signal representing a second bound, the second input leg of the first comparator and the first input leg of the second comparator both being adapted to receive another input signal, the first and second comparator circuits collectively being adapted to generate an output indicative of whether or not the other input signal falls within the first and second bounds.

22. The comparator circuit of claim 1 having at least a third input leg coupled to the first node of the evaluation element adjacent the first input leg, the third input leg having associated therewith a variable parameter having a value that is a function of a corresponding input signal, the evaluation element being adapted to perform a comparison of the result of an addition of at least first and third inputs applied to the respective first and third input legs with a second input applied to the second input leg.

23. The comparator circuit of claim 22 being implemented as a serial adder-binary search (SA-BS) circuit having a finite state machine being adapted to generate inputs for application to the second input leg in accordance with a binary search process, so as to determine the result of an addition of inputs applied to the first and third input legs.

24. The comparator circuit of claim 23 wherein the SA-BS circuit is one of m SA-BS circuits each being adapted to perform an n-bit function so as to implement an m×n-bit serial adder.

25. The comparator circuit of claim 1 wherein a first set of input legs associated with the first node of the evaluation element and a second set of input legs associated with the second node of the evaluation element are adapted to receive a substantially constant current, for at least a designated period of time, so as to implement an analog adder function.

26. The comparator circuit of claim 1 having a first plurality of input legs including the first leg coupled to the first node of the evaluation element, and a second plurality of input legs including the second input leg coupled to the second node of the evaluation element, each of the input legs having associated therewith a variable parameter having a value that is a function of a corresponding input signal, the evaluation element being adapted to perform a comparison of the result of an addition of a first plurality of inputs applied to respective ones of the first plurality of input legs with the result of an addition of a second plurality of inputs applied to respective ones of the second plurality of input legs.

27. The comparator circuit of claim 26 further comprising a multiplexer being adapted to select a particular pair of the inputs for propagation to an output thereof so as to implement an add-compare-select (ACS) function.

28. The comparator circuit of claim 26 being one of a plurality of ACS circuits, each being adapted to compare at least a first pair of inputs with a second pair of inputs, the plurality of ACS circuits being implemented in a layered architecture having a plurality of layers including a final layer having a single one of the ACS circuits, the layered architecture being adapted such that winning pairs from one layer are compared against one another at a subsequent layer until a final winning pair is identified.

29. The comparator circuit of claim 28 further comprising an associated adder being adapted to perform an addition of the final winning pair of inputs.

30. The comparator circuit of claim 1 being a first comparator circuit and further comprising at least a second comparator circuit coupled in parallel therewith so as to implement a coupled memory cell comparator.

31. The comparator circuit of claim 30 further comprising a third comparator circuit having first and second input legs each coupled to a corresponding one of a first and second input leg of one of the first comparator circuit and the second comparator circuit.

32. The comparator circuit of claim 1 wherein the first and second input legs each have associated therewith a plurality of mask inputs, the mask inputs being adapted to receive mask signals operative to configure the first and second input legs so as to implement a masking of corresponding portions of the first and second input signals from consideration in the comparison performed by the evaluation element.

33. The comparator circuit of claim 1 wherein the first and second input legs each comprise a plurality of variable resistances arranged in a stack, each of the variable resistances having an input associated therewith, and the evaluation element comprises a differential amplifier.

34. The comparator circuit of claim 1 wherein at least one of the first and second input legs includes an offset signal input, the offset signal input being adapted to introduce signal information into the comparator circuit.

35. The comparator circuit of claim 34 wherein the signal information comprises carry input signal information.

36. A comparator circuit comprising:
an evaluation element; and
at least first and second input legs each coupled to a corresponding one of a first and second node of the evaluation element, the first and second input legs being adapted to receive respective first and second non-complementary input signals, each of the first and second input legs having associated therewith a variable parameter having a value that is a function of a corresponding one of the input signals, the evaluation element being adapted to perform a comparison of the first and second input signals.

37. An integrated circuit comprising:
at least one comparator circuit, the comparator circuit comprising an evaluation element, and at least first and second input legs each coupled to a corresponding one of a first and second node of the evaluation element, the first and second input legs having non-complementary structures relative to one another and being adapted to receive respective first and second input signals, each of the non-complementary structures having associated therewith a variable parameter having a value that is a function of a corresponding one of the input signals, the evaluation element being adapted to perform a comparison of first and second input signals.

38. A comparator circuit comprising:

an evaluation element; and at least first and second input legs each coupled to a corresponding one of a first and second node of the evaluation element, the first and second input legs being adapted to receive respective first and second input signals, each of the first and second input legs having associated therewith a variable parameter having a value that is a function of a corresponding one of the input signals, the evaluation element being adapted to perform a comparison of the first and second input signals, wherein outputs of the comparator circuit are isolated from corresponding output nodes of the evaluation element such that the comparison is substantially independent of asymmetry associated with the outputs of the comparator circuit.

39. A circuit comprising at least first and second input legs, the first and second input legs having non-complementary structures relative to one another, each of the non-complementary structures having associated therewith a variable parameter having a value that is a function of a corresponding input signal, a difference in the variable parameters associated with the first and second input legs being detectable in the circuit;

wherein at least one of the first and second input legs comprises a weighted array of transistors, each of the transistors in the weighted array adapted to receive a particular portion of an input signal applied to that leg.

40. The circuit of claim 39 further comprising an evaluation element, wherein the first and second input legs are each coupled to a corresponding one of a first and second node of the evaluation element, the evaluation element being adapted to perform a comparison of first and second input signals applied to the respective first and second input legs.

* * * * *